US012787818B2

(12) United States Patent
Trindade et al.

(10) Patent No.: US 12,787,818 B2
(45) Date of Patent: Nov. 3, 2026

(54) PRINTED DEVICES IN CAVITIES

(71) Applicant: X-Celeprint Limited, Dublin (IE)

(72) Inventors: António José Marques Trindade, Cork (IE); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 612 days.

(21) Appl. No.: 17/972,484

(22) Filed: Oct. 24, 2022

(65) Prior Publication Data

US 2023/0093573 A1 Mar. 23, 2023

Related U.S. Application Data

(63) Continuation-in-part of application No. 17/404,300, filed on Aug. 17, 2021, now abandoned.

(60) Provisional application No. 63/272,652, filed on Oct. 27, 2021.

(51) Int. Cl.
*H10W 70/65* (2026.01)
*H10W 74/10* (2026.01)
*H10W 90/00* (2026.01)

(52) U.S. Cl.
CPC ......... *H10W 70/65* (2026.01); *H10W 74/131* (2026.01); *H10W 90/734* (2026.01)

(58) Field of Classification Search
CPC . H01L 24/20; H01L 21/4853; H01L 21/4857; H01L 21/4871; H01L 21/78; H01L 23/367; H01L 23/5383; H01L 23/5386; H01L 24/19; H01L 2224/214; H01L 2924/10253; H01L 2924/10271; H01L 2924/1033; H01L 2924/13091; H01L 2924/19105
See application file for complete search history.

(56) References Cited

U.S. PATENT DOCUMENTS 5,674,773 A 10/1997 Koh et al.
6,309,912 B1 * 10/2001 Chiou .................... H01L 24/82 438/126
7,622,367 B1 11/2009 Nuzzo et al.
7,943,491 B2 5/2011 Nuzzo et al.
8,039,847 B2 10/2011 Nuzzo et al.
8,722,458 B2 5/2014 Rogers et al.
8,889,485 B2 11/2014 Bower
9,520,537 B2 12/2016 Bower et al.
10,008,483 B2 6/2018 Cok et al.
10,714,374 B1 7/2020 Cok et al.
2010/0044853 A1 2/2010 Dekker et al.
2012/0049388 A1 * 3/2012 Pagaila .................. H01L 24/96 438/118
2014/0035114 A1 * 2/2014 Gogoi ................ H01L 25/0652 257/676

(Continued)

*Primary Examiner* — Jacob Y Choi
*Assistant Examiner* — Neil R Prasad
(74) *Attorney, Agent, or Firm* — Choate, Hall & Stewart LLP; Michael D. Schmitt

(57) ABSTRACT

A micro-device structure includes a substrate having a substrate surface and a substrate contact disposed on or in the substrate surface, a cavity extending into the substrate from the substrate surface, a micro-device disposed in the cavity, the micro-device comprising a micro-device contact, a planarization layer disposed over at least a portion of the substrate, and an electrode disposed at least partially over or on the planarization layer and electrically connected to the micro-device contact.

21 Claims, 20 Drawing Sheets

(56) References Cited

U.S. PATENT DOCUMENTS

| | | | | |
|---|---|---|---|---|
| 2014/0252655 | A1 | 9/2014 | Tran et al. | |
| 2014/0267683 | A1 | 9/2014 | Bibl et al. | |
| 2015/0266721 | A1* | 9/2015 | Yoshizawa | B81C 1/00246 257/414 |
| 2016/0163765 | A1* | 6/2016 | Hu | H10H 20/8506 438/34 |
| 2018/0062116 | A1 | 3/2018 | Park et al. | |
| 2020/0177163 | A1 | 6/2020 | Cok | |
| 2020/0303294 | A1* | 9/2020 | Chang | H01L 25/50 |
| 2022/0246584 | A1 | 8/2022 | Hwang et al. | |

* cited by examiner

PRINTED DEVICES IN CAVITIES

PRIORITY APPLICATIONS

This application is a continuation-in-part of U.S. patent application Ser. No. 17/404,300, filed on Aug. 17, 2021, and also claims the benefit of U.S. Provisional Patent Application No. 63/272,652, filed on Oct. 27, 2021, the disclosure of each of which is hereby incorporated by reference herein in its entirety.

TECHNICAL FIELD

The present disclosure generally relates to the micro-assembly and electrical connection of micro-integrated circuits using micro-transfer printing.

BACKGROUND

Components can be transferred from a source wafer to a target substrate using micro-transfer printing. Methods for transferring small, active components (e.g., micro-devices) from one substrate to another are described in U.S. Pat. Nos. 7,943,491, 8,039,847, and 7,622,367. In these approaches, small integrated circuits are formed on a native semiconductor source wafer. The small, unpackaged bare-die integrated circuits, or chiplets, are released from the native source wafer by pattern-wise etching sacrificial portions of a sacrificial layer located beneath the chiplets, leaving each chiplet suspended over an etched sacrificial portion by a tether physically connecting the chiplet to an anchor separating the etched sacrificial layer portions. A viscoelastic stamp is pressed against the process side of the chiplets on the native source wafer, adhering each chiplet to an individual stamp post. The stamp with the adhered chiplets is then removed from the native source wafer. The chiplets on the stamp posts are pressed against a non-native target substrate or backplane with the stamp and adhered to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a target substrate or backplane.

Electrically connecting integrated circuit structures on a wafer or other substrate can be difficult if the integrated circuit structures extend a significant height above the substrate. This height is commonly called a step height and can be, for example, no less than two microns, no less than five microns, no less than ten microns, or no less than twenty microns. Electrical connections to integrated circuit structures are commonly made on the top (e.g., the process surface) of an integrated circuit structure. When conductive materials, for example metals used to make electrodes or electrical wires, are deposited on a substrate, for example by evaporation or sputtering, the materials tend to deposit more thickly on horizontal surfaces (e.g., the substrate surface or micro-device top surface) than on vertical surfaces (e.g., the side of an integrated circuit or micro-device structure) causing relatively poor, or no, electrical conductivity on the vertical surface. This problem becomes more significant as the step height increases. Conventionally, this problem is addressed by making a more gradual transition from a substrate surface to the top of the integrated circuit structure so that conductive material deposits thicker on the gradual and less steep transition. For example, dielectric materials can be deposited and patterned with sloped walls. However, this approach makes the connected structure larger, inhibiting desirable miniaturization. Another method relies on planarizing the substrate surface so that the substrate surface is approximately in the same plane, or even slightly above, a top surface of the integrated circuit structure. This approach is described in, for example, U.S. Pat. No. 5,674,773 entitled Method for planarizing high step-height integrated circuit structures. However, a thick planarization layer can inhibit forming electrical connections to a metal layer, contact pad, or conductor (wire) on the substrate surface, since vias will be necessary to open the electrical connections and the side walls of the vias can suffer from the same step height problem.

There is a need, therefore, for integrated-circuit structures and methods that facilitate electrical connections between the integrated-circuit structures.

SUMMARY

The present disclosure provides, inter alia, structures and methods for a micro-device structure that includes a substrate having a substrate surface, a cavity disposed in and extending into the substrate from the substrate surface, a micro-device disposed in the cavity, the micro-device comprising a micro-device contact, a planarization layer disposed over at least a portion of the substrate, and an electrode disposed at least partially over or on the planarization layer and electrically connected to the micro-device contact. The planarization layer can be a cavity-filling layer and need not planarize the entire substrate surface.

According to some embodiments, the micro-device structure comprises a substrate contact disposed on or in the substrate surface and the electrode is electrically connected to the substrate contact. The substrate contact can be an electrode, wire, contact pad or other electrically conductive structure disposed on the substrate. The micro-device can comprise a separated or broken (e.g., fractured) tether as a consequence of micro-transfer printing the micro-device from a micro-device source wafer into the cavity in the substrate. The planarization layer can be disposed at least partly in the cavity and the micro-device can be disposed at least partly on at least a portion of the planarization layer in the cavity.

According to some embodiments, (i) the micro-device has a thickness no greater than two microns, no greater than five microns, no greater than ten microns, no greater than fifteen microns, or no greater than twenty microns, (ii) the cavity has a depth of no greater than 500 nm, no greater than one micron, no greater than two microns, no greater than five microns, no greater than ten microns, no greater than fifteen microns, or no greater than twenty microns, (iii) the planarization layer has a thickness over the substrate surface of no greater than ten nm, no greater than twenty nm, no greater than thirty nm, no greater than fifty nm, no greater than sixty nm, no greater than seventy-five nm, no greater than one hundred nm, no greater than two hundred fifty nm, no v than five hundred nm, or no greater than one micron, or (iv) any compatible combination of (i), (ii), and (iii).

The substrate surface and a top surface of the micro-device can be separated by a distance no greater than five microns, no greater than three microns, no greater than two microns, no greater than one micron, or no greater than five hundred nm in a direction orthogonal to the substrate surface.

According to some embodiments of the present disclosure, the micro-device is a first micro-device, the micro-device contact is a first micro-device contact and the micro-device structure comprises a second micro-device disposed in the cavity, the second micro-device comprising a second micro-device contact, and the electrode electrically connects the first micro-device contact to the second micro-device contact.

According to some embodiments, the substrate surface and a top surface of the micro-device are separated by a distance less than a thickness of the micro-device (e.g., no more than half of the thickness, no more than a quarter of the thickness, no more than an eighth of the thickness, or no more than a tenth of the thickness).

According to some embodiments of the present disclosure, the micro-device is a first micro-device, the micro-device contact is a first micro-device contact, the cavity is a first cavity, and the micro-device structure comprises a second micro-device disposed in a second cavity extending into the substrate from the substrate surface, the second micro-device comprising a second micro-device contact, and the electrode electrically connects the first micro-device contact to the second micro-device contact.

According to some embodiments of the present disclosure, a micro-device structure comprises a substrate having a substrate surface, one or more cavities extending into the substrate from the substrate surface, two or more micro-devices, at least one of the micro-devices disposed in each of the one or more cavities, each of the micro-devices comprising a micro-device contact, and an electrode electrically connecting at least a first micro-device contact of a first one of the micro-devices and a second micro-device contact of a second one of the micro-devices. The one or more cavities can comprise at least two cavities, two or more of the micro-devices are disposed in one of the one or more cavities, or both. According to some embodiments, a planarization layer is disposed over at least a portion of the substrate. According to some embodiments, a first cavity of the one or more cavities extends a first distance into the substrate, a second cavity of the one or more cavities extends a second distance into the substrate, and the first distance is different from the second distance. According to some embodiments, a first micro-device of the two or more micro-devices has a first thickness, a second micro-device of the two or more micro-devices has a second thickness, and the first thickness is different from the second thickness. Some embodiments of the present disclosure comprise a substrate contact disposed on or in the substrate surface and the electrode is electrically connected to the substrate contact.

According to some embodiments, a top surface of the micro-device is separated from the substrate surface by a distance no greater than five microns, no greater than three microns, no greater than two microns, no greater than one micron, or no greater than five hundred nm in a direction orthogonal to the substrate surface. According to some embodiments, the micro-device comprises a separated or broken (e.g., fractured) tether as a consequence of micro-transfer printing the micro-device.

According to embodiments of the present invention, ones of the micro-devices (i) have different functionalities, (ii) comprise different materials (e.g., different semiconductors) (e.g., have been printed from different source wafers), or (iii) both (i) and (ii). Some embodiments further comprise a second electrode electrically connecting at least a third micro-device contact of a third one of the micro-devices and a fourth micro-device contact of a fourth one of the micro-devices. The electrode can further electrically connect at least a third micro-device contact of a third one of the micro-devices.

According to some embodiments of the present disclosure, a method of making a micro-device structure comprises providing a substrate having a substrate surface and one or more cavities extending into the substrate from the substrate surface, providing a micro-device source wafer comprising one or more micro-devices disposed on or in the micro-device source wafer, each comprising a micro-device contact, micro-transfer printing the one or more micro-devices from the micro-device source wafer into the one or more cavities, planarizing the substrate, and forming an electrode disposed at least partially over or on the planarization layer that electrically connects to the micro-device contact of at least one of the micro-devices. Some embodiments comprise forming one or more vias in the planarizing layer prior to forming the electrode and forming the electrode comprises forming a portion of the electrode in the via. The one or more vias can have sloped sides. Forming the electrode can comprise forming one or electrodes on the substrate surface or in electrical contact with a substrate contact disposed on the substrate surface. The at least one of the micro-devices can be at least two of the micro-devices. The substrate can comprise a substrate contact disposed on or in the substrate surface and forming the electrode can comprise electrically connecting the electrode to the substrate contact.

According to some embodiments of the present disclosure, a micro-device structure comprises a substrate having a substrate surface, a cavity extending into the substrate from the substrate surface, a micro-device disposed in the cavity, and a planarization layer disposed over at least a portion of the substrate and in contact with the micro-device and the cavity. At least a portion of the micro-device can be exposed and the planarization layer can extend over only a portion of the micro-device.

In some embodiments, the planarization layer has a pit adjacent to the micro-device or a protrusion adjacent to or over the micro-device. The pit can be disposed between a side of the micro-device non-parallel to the substrate surface and a side of the cavity non-parallel to the substrate surface, e.g., between a side of the micro-device and a side of the cavity.

According to some embodiments, the micro-device structure comprises a via formed through the planarization layer that exposes a portion of the substrate surface or exposes a layer or structure disposed on the substrate surface. The planarization layer can have a planarization layer surface on a side of the planarization layer opposite the substrate and the micro-device has a micro-device surface on a side of the micro-device opposite the substrate. The via can have a via side width that extends from the planarization layer surface to the substrate surface or to the layer or structure formed on the substrate surface. The planarization layer can have a device via side width that extends from the planarization layer surface to the micro-device surface. The device via side width can be greater than the via side width.

According to some embodiments, the planarization layer has a planarization layer surface on a side of the planarization layer opposite the substrate and the micro-device has a micro-device surface on a side of the micro-device opposite the substrate. The via can have a via edge that extends from the planarization layer surface to the substrate surface or to the layer or structure formed on the substrate surface, so that the via edge has an average via slope with respect to the substrate surface. The planarization layer can have a planarization edge that extends from the planarization layer surface to the micro-device surface, so that the planarization edge has an average micro-device planarization slope with respect to the substrate surface. The via slope can be greater than the micro-device planarization slope.

In some embodiments, the substrate of the micro-device structure comprises a substrate contact disposed on the substrate in the via, the micro-device comprises a micro-device contact disposed on a surface of the micro-device opposite the substrate, and the micro-device structure comprises an electrode disposed on a portion of the planarization layer opposite the substrate that electrically connects the substrate contact to the micro-device contact. The micro-device contact can be a first micro-device contact and in some embodiments the micro-device can comprise a second micro-device contact disposed on the surface of the micro-device opposite the substrate so that a first portion of the first micro-device contact is exposed through the planarization layer, a second portion of the second micro-device contact is exposed through the planarization layer, and the first portion is larger than the second portion.

In some embodiments, a side of the micro-device non-parallel to the substrate surface can be closer to a side of the cavity non-parallel to the substrate surface than any other side of the micro-device non-parallel to the substrate surface is to any side of the cavity. The side of the micro-device can be in contact with the side of the cavity or can be within one micron of the side of the cavity. Two sides of the micro-device non-parallel to the substrate surface can each be closer to a respective one of two sides of the cavity non-parallel to the substrate surface than any other sides of the micro-device non-parallel to the substrate surface are to any side of the cavity, e.g., so that the micro-device is disposed in a corner of the cavity. In some embodiments a center of the micro-device is not coincident with a center of the cavity.

According to some embodiments of the present disclosure, a surface of the micro-device opposite the substrate extends farther from the substrate surface than a surface of the planarization layer opposite the substrate. A surface of the planarization layer opposite the substrate can extend farther from the substrate surface than a surface of the micro-device opposite the substrate. A surface of the micro-device opposite the substrate can be below a surface of the planarization layer with respect to the substrate. The micro-device can be entirely within the cavity. The micro-device can be only partly within the cavity and can extend above the cavity with respect to the substrate. The planarization layer can extend over only a portion of a surface of the micro-device opposite the substrate.

In some embodiments, the micro-device comprises a broken (e.g., fractured) or separated micro-device tether, is a bare, unpackaged die, or both.

According to embodiments of the present disclosure, a substrate structure comprises a substrate having a substrate surface and a patterned cured layer disposed on and in contact with the substrate surface. The patterned cured layer can have a layer surface on a side of the patterned cured layer opposite the substrate surface. A first portion of the patterned cured layer can cover a first portion of the substrate surface and a second portion of the patterned cured layer can cover a second portion of the substrate surface, a first via can extend from the layer surface to the substrate surface in the first portion, and a second via can extend from the layer surface to the substrate surface or a structure disposed on or in the substrate in the second portion. The first via can have a first via edge width and the second via can have a second via edge width greater than the first via edge width so that a slope of the first via is greater than a slope of the second via. In some embodiments, the patterned cured layer comprises a photoresist, for example a positive photoresist or a negative photoresist.

In some embodiments, a patterned metal layer can be disposed on the second portion. The patterned metal layer can extend into the first portion. The patterned cured layer can be cross linked and can comprise, for example, epoxy, resin, benzocyclobutene, or Intervia photodielectric (e.g., a photo-patternable dielectric material).

In some embodiments, a micro-device can be disposed on the substrate surface and the second portion can be in contact with the micro-device. The micro-device can extend no less than 5 microns (e.g., no less than 10 microns, no less than 15 microns, or no less than 20 microns) from the substrate surface.

According to embodiments of the present disclosure, a method of making a substrate structure comprises providing a substrate having a substrate surface, disposing a curable layer on the substrate surface, providing a dithered mask over the substrate surface and over the curable layer, the dithered mask comprising light portions that are substantially transparent, dark portions that are substantially opaque, and dithered portions that are more transparent than the dark portions and less transparent than the light portions, exposing the curable layer to electromagnetic radiation through the dithered mask to pattern and partially cure the curable layer forming completely cured portions of the curable layer, completely uncured portions of the curable layer, and portions of the curable layer that are partially cured, and developing the curable layer to cure the curable layer and form a patterned cured layer having a variable thickness. The patterned cured layer can have a first via with a first side edge width and a second via can have a second via side width greater than the first via side width. Some embodiments comprise reflowing the patterned cured layer.

The curable layer can be a photoresist, for example a positive photoresist or a negative photoresist. Some embodiments of the present disclosure can comprise hard curing the patterned cured layer, for example so that the patterned cured layer has a slope with an angle no greater than 45 degrees, no greater than 30 degrees, no greater than 20 degrees, or no greater than 10 degrees with respect to the substrate surface.

Some embodiments of the present disclosure comprise micro-transfer printing a micro-device onto the substrate surface or printing a micro-device into a cavity in the substrate. Some embodiments comprise micro-transfer printing the micro-device with offset shear.

According to some embodiments of the present disclosure, a variable-resolution photolithographic mask comprises one or more dark areas that are relatively opaque to electromagnetic radiation and one or more light areas that are relatively transparent to electromagnetic radiation, the mask substrate having one or more spatial areas of transparency transition from one of the one or more dark areas to one of the one or more light areas. At least one of the one or more spatial areas of transparency transition comprises a high-resolution transition area that changes from relatively opaque to relatively transparent in a first spatial distance and a low-resolution transition area that changes from relatively opaque to relatively transparent in a second spatial distance greater than the first spatial distance.

The low-resolution transition area can comprise a variable density of electromagnetic-radiation-absorbing material or electromagnetic-radiation-reflecting material in or on a mask substrate. The electromagnetic-radiation-absorbing material or electromagnetic-radiation-reflecting material in or on the mask substrate can comprise chromium or carbon black.

The low-resolution transition area can comprise a pattern of one or more structures that have a variable spatial density of a constant amount of electromagnetic radiation material absorbing material in the mask substrate. The pattern of one or more structures can comprise triangles, lines with varying widths, areas having curved edges, dots, or rectangles.

Embodiments of the present disclosure provide improved electrical connections between the micro-device contacts on a top surface of a micro-device disposed on a substrate and substrate contacts or electrical connections on the substrate or a layer disposed on the substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
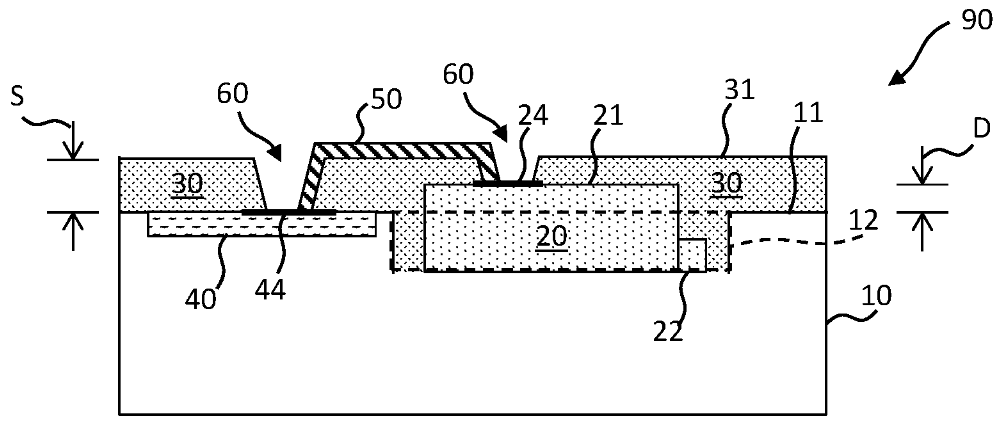
FIG. 1A is a cross section according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, micro-device structures comprising one or more micro-devices disposed on a substrate that are electrically connected, for example with a photolithographically defined wire or other electrical connection, to electrical connections, contacts, or wires on the substrate or a layer disposed on the substrate or to other micro-devices. Embodiments of the present disclosure provide structures with a reduced step height (e.g., a distance) between the top surface of a micro-device and the substrate or layer disposed on the substrate, where the top or top surface of a micro-device is a side of the micro-device opposite the substrate so that the micro-device is between the top surface and at least some portion of the substrate. Structures with such reduced step heights enable improved electrical connections between the top surface of the micro-device and electrical conductors on the substrate surface or a layer disposed on the substrate surface, for example by reducing vertical or steep edges in the structure and the need to deposit material on the vertical or steep edges. Such steep edges can be found on the side of a micro-device or the side or edge of a via. According to some embodiments, micro-devices provided as a bare die (e.g., without an integrated circuit package) can have a micro-device substrate thickness no less than five, ten, fifteen, or twenty microns with steep (e.g., substantially or effectively orthogonal to a top surface of the micro-device) edge or side of the micro-device. Where a surface of the substrate or top surface of the micro-device are effectively horizontal, such steep edges can be effectively vertical, or nearly so. Disposing material (e.g., electrically conductive material such as metal) on such steep or vertical edges can be difficult, especially where the thickness of the deposited metal (e.g., less than five microns) is less than the step height of the micro-device on the substrate (e.g., no less than five, ten, fifteen, or twenty microns, or even more). Because deposited material coverage on the steep or vertical edges can be poor, electrical connections between the top surface of the micro-device and the substrate can be likewise poor or non-existent and can therefore have a high resistance or form an electrical open (e.g., no electrical continuity between electrical contacts on the top surface of the micro-device and electrical conductors on the substrate).

According to embodiments of the present invention and as illustrated in FIGS. 1A, 1B, 1C, and 1D, a micro-device structure 90 comprises a substrate 10 having a substrate surface 11 and a substrate contact 44 disposed on or in substrate surface 11, a cavity 12 (indicated with a dashed rectangle) disposed in substrate 10 extending to substrate surface 11, a micro-device 20 disposed in cavity 12, micro-device 20 comprising a micro-device 20 top surface 21 on or in which is disposed micro-device contact 24, a planarization layer 30 having a planarization layer surface 31 disposed over at least a portion of substrate 10, and an electrode 50 electrically connected to micro-device contact 24 and to substrate contact 44. Substrate 10 can be a target or destination substrate 10 having cavity 12 in which is disposed micro-device 20 (e.g., by micro-transfer printing micro-device 20 from a micro-device 20 source wafer to target substrate 10). Micro-device 20 can consequently comprise a tether 22 that is fractured or separated as a consequence of micro-transfer printing micro-device 20 from a micro-device source wafer to target substrate 10. Substrate contact 44 can be an electrical contact (e.g., a contact pad), a wire, an electrode, or any other electrode disposed on substrate 10 or a layer disposed on substrate 10.

Figure 1B:
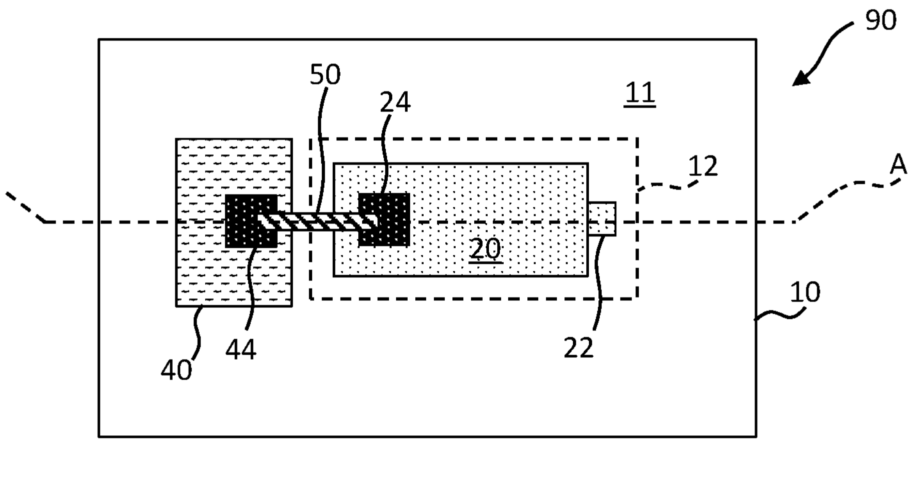
FIG. 1B is a plan view excluding the planarization layer with a cross section line A corresponding to FIG. 1A according to illustrative embodiments of the present disclosure.
Figure 1C:
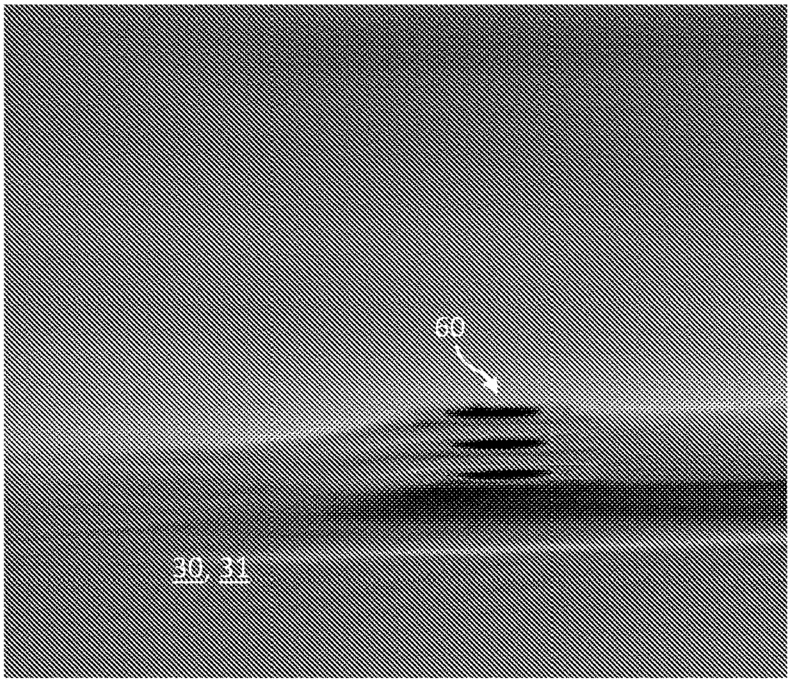
FIG. 1C is a perspective micro-graph according to illustrative embodiments of the present disclosure.
Figure 1D:
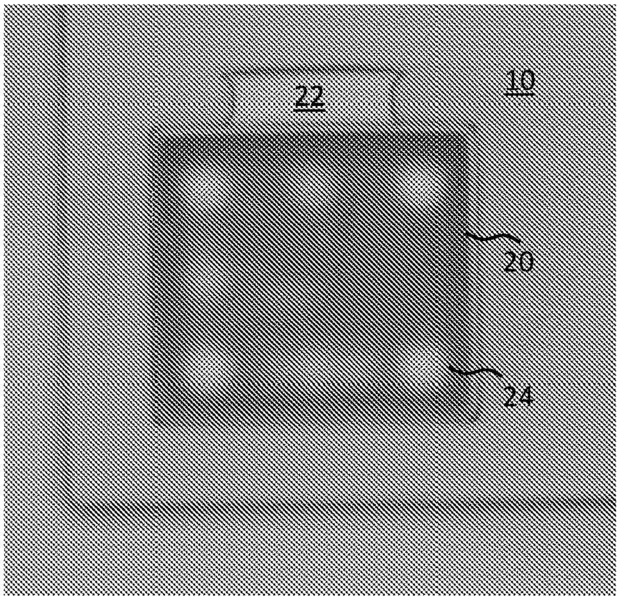
FIG. 1D is a plan view micro-graph according to illustrative embodiments of the present disclosure.

As shown in the plan view of FIG. 1B excluding planarization layer 30 and the cross section of FIG. 1A taken across cross section line A of FIG. 1B, planarization layer surface 31 can extend over or above micro-device 20 and vias 60 can be provided in planarization layer 30 over micro-device contact 24 to enable electrodes 50 to contact micro-device contact 24 and substrate contact 44. Micro-device 20 can extend above substrate surface 11 a distance D and step height S indicates the largest step height in the electrical connection provided by electrode 50. A substrate circuit 40 can be formed in or on substrate 10 and electrically connected to substrate contact 44. Thus, substrate circuit 40 can be electrically connected to micro-device 20 with electrode 50 through one or more vias 60 disposed in planarization layer 30 over substrate contact 44. (For clarity of illustration, FIG. 1B omits planarization layer 30 to expose other elements of the Figure.) FIG. 1C is a perspective micro-graph of planarization layer 30 disposed on substrate 10 with vias 60 opening micro-device contacts 24 (shown in FIGS. 1A, 1B, micro-device contacts 24 are not visible in FIG. 1C.) FIG. 1D is a plan micro-graph of micro-device 20 disposed on substrate 10 with micro-device contacts 24 and fractured tether 22.

Embodiments of the present disclosure are well adapted to electrically connecting small integrated circuits (e.g., micro-devices 20) disposed on substrate 10, for example integrated circuits that are bare die and are not packaged. Such small integrated circuits can provide improved utilization of source wafers and improved circuit density and performance for heterogeneous systems comprising circuits made in different materials and native to different source wafers or source substrates. In embodiments of the present disclosure, micro-device 20 has a thickness no less than two microns, no less than five microns, no less than ten microns, no less than fifteen microns, or no less than twenty microns. Micro-device 20 can have a length or width, or both, of no greater than two hundred microns (e.g., no greater than one hundred microns, no greater than fifty microns, no greater than twenty microns, no greater than ten microns, or no greater than five microns).

According to embodiments of the present disclosure, a reduced step height between micro-device top surface 21 and substrate surface 11 can be provided by disposing micro-device 20 in cavity 12 so that micro-device top surface 21 is closer to substrate surface 11 than would be the case if micro-device 20 were placed on substrate surface 11 without cavity 12. Thus, in embodiments cavity 12 can have a depth substantially equal or relatively close to a thickness of micro-device 20, e.g., within five percent, ten percent, twenty percent, or fifty percent. In some embodiments, cavity 12 has a depth of no less than 500 nm, no less than one micron, no less than two microns, no less than five microns, no less than ten microns, no less than fifteen microns, or no less than twenty microns. Thus, according to embodiments, substrate surface 11 and micro-device top surface 21 are separated by a distance no greater than five microns (e.g., no greater than three microns, no greater than two microns, no greater than one micron, or no greater than five hundred nm) in a direction orthogonal to substrate surface 11.

In embodiments of the present disclosure, a reduced step height between micro-device top surface 21 and substrate surface 11 can be provided by providing planarization layer 30 with a thickness substantially equal to or relatively close to a height (e.g., distance D in FIG. 1A) that micro-device 20 extends or protrudes from substrate surface 11. For example, planarization layer 30 has a depth that is substantially equal to a distance between micro-device top surface 21 and substrate surface 11 or is within five percent, ten percent, twenty percent, or fifty percent of the distance. By providing a planarization layer 30 depth that matches the height (e.g., distance D in FIG. 1A) that micro-device 20 extends or protrudes from substrate surface 11, the thickness of planarization layer 30 over or on micro-device 20 is small so that vias 60 over micro-device 20 are very shallow and step height S of electrode 50 over micro-device 20 is likewise small, enabling good material deposition and electrical connection to micro-device contact 24. Thus, according to embodiments of the present disclosure, planarization layer 30 has a thickness over substrate surface 11 (or a layer disposed on substrate surface 11) of no greater than one micron (e.g., no greater than ten nm, no greater than twenty nm, no greater than thirty nm, no greater than fifty nm, no greater than sixty nm, no greater than seventy-five nm, no greater than one hundred nm, no greater than two hundred fifty nm, or no greater than five hundred nm). Where micro-device 20 protrudes above substrate surface 11, via 60 opening substrate contact 44 will have a greater step height S than via 60 opening micro-device contact 24 but is still smaller than would be the case if a thicker planarization layer 30 was coated over substrate surface 11, enabling good material deposition and electrical connection to substrate contact 44.

Figure 2:
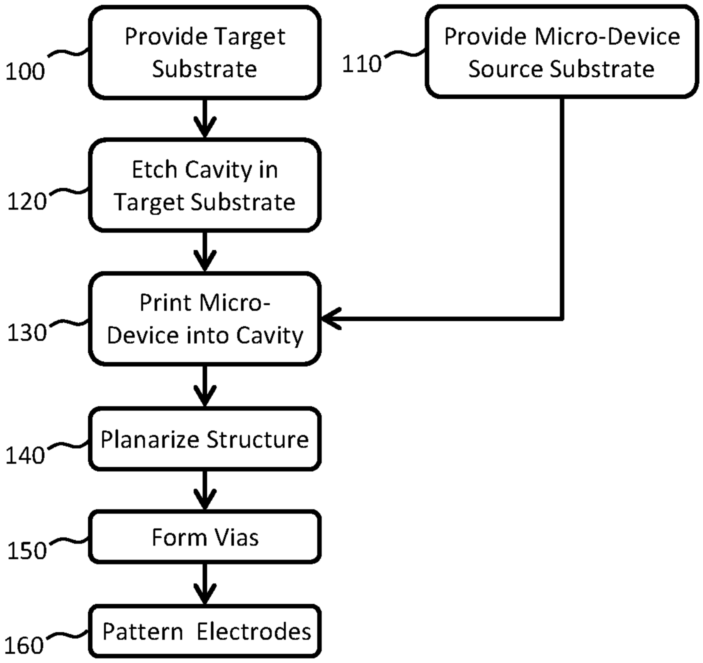
FIG. 2 is a flow diagram according to illustrative embodiments of the present disclosure.
Figure 3A:
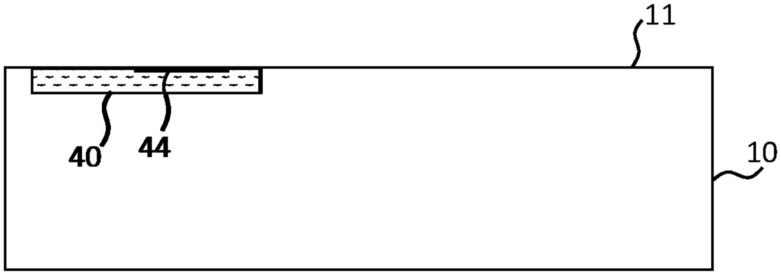
FIGS. 3A-3F are successive cross sections showing steps in constructing a micro-device structure according to illustrative embodiments of the present disclosure.
Figure 3B:
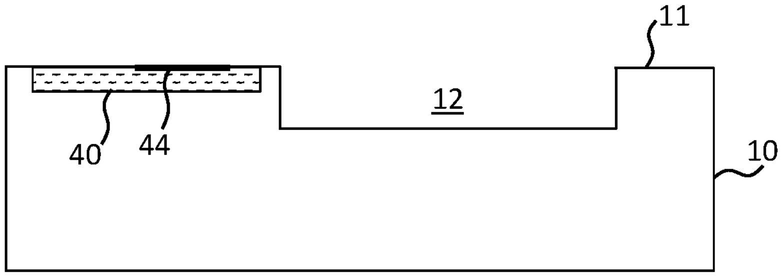

According to embodiments of the present disclosure and as illustrated in the flow diagram of FIG. 2 and the successive cross sections of FIGS. 3A-3G, a method of making a micro-device structure 90 comprises providing a substrate 10 having a substrate surface 11 in step 100. A substrate contact 44 can be disposed on or in substrate surface 11 and a substrate circuit 40 electrically connected to substrate contact 44 can be disposed on or in substrate surface 11, as shown in FIG. 3A. A cavity 12 can be disposed in substrate 10 that extends to substrate surface 11 (e.g., by etching), in step 120 and as shown in FIG. 3B. (In some embodiments, substrate contact 44, substrate circuit 40, and cavity 12 can be provided in step 100 and step 120 is optional.) Cavity 12 can be made before, during, or after substrate circuit 40 or substrate contact 44 is formed. Substrate 10 can be any suitable substrate 10 having substrate surface 11 suitable for micro-transfer printing and photolithographic processing, for example a glass or polymer substrate as found in the display and photolithographic industries. Substrate circuit 40, substrate contact 44, and cavity 12 can be constructed on or in substrate surface 11 using photolithographic methods and materials such as are used in the display and integrated circuit industries. A micro-device source wafer (not shown in the Figures) is provided in step 110 with one or more micro-devices 20 disposed on or in the micro-device source wafer. Micro-device source wafer can comprise sacrificial portions separated by anchors and micro-devices 20 can be disposed directly and completely over the sacrificial portions and physically connected to anchors by tethers 22 so that micro-devices 20 can be transfer printed (e.g., micro-transfer printed) from micro-device source wafer to substrate 10. Such micro-device source wafers can be constructed using photolithographic materials and methods, for example silicon wafers or semiconductor-on-insulator wafers.

Figure 3C:
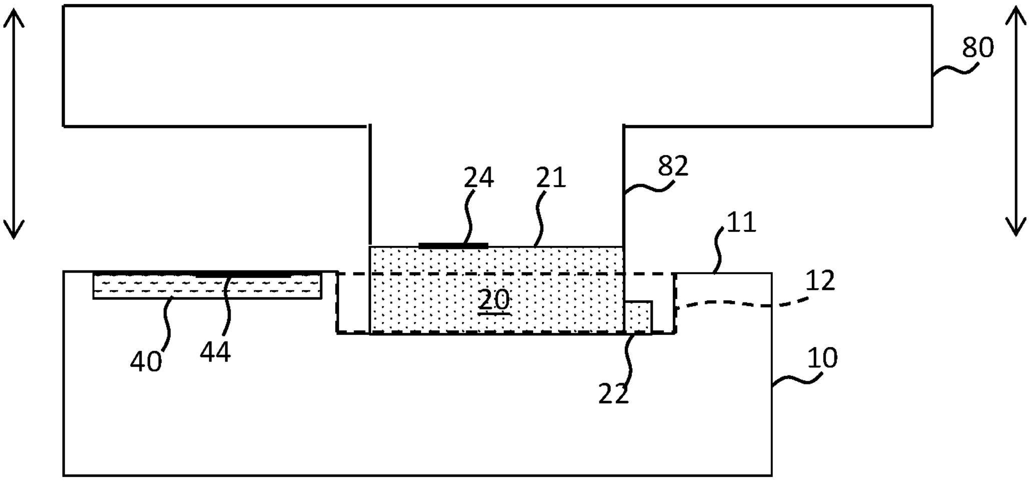
Figure 3D:
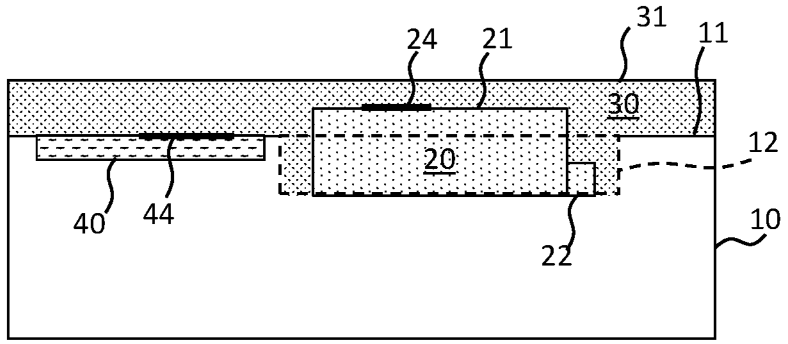

In step 130 and as shown in FIG. 3C, one or more micro-devices 20 are micro-transfer printed from the micro-device source wafer into cavity 12 of substrate 10, for example with a stamp 80 such as a PDMS stamp 80 having stamp posts 82 temporarily adhered to micro-device 20, fracturing or separating tether 22 in the process. In step 140 and as shown in FIG. 3D, a planarization layer 30 is disposed at least partly over substrate 10. In some embodiments, planarization layer 30 extends over substantially extends over substrate surface 11 and micro-device 20 and optionally within cavity 12. Planarization layer 30 can be an organic material deposited by spin coating or spray coating, for example benzocyclobutene (BCB), Intervia, an epoxy, or a photo-resist. Planarization layer 30 material can be curable, e.g., with heat or by exposure to electromagnetic radiation (e.g., ultraviolet radiation). Planarization layer 30 can at least partially planarize substrate 10, micro-device 20, and cavity 12, for example forming a surface that is more planar and has less topography than substrate 10, micro-device 20, and cavity 12 in the absence of planarization layer 30.

Figure 3E:
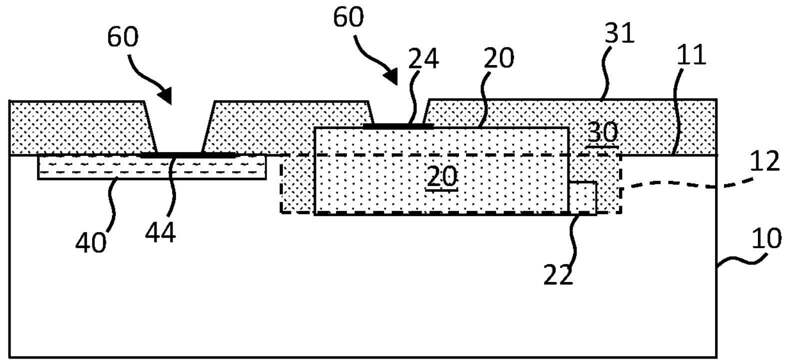
Figure 3F:
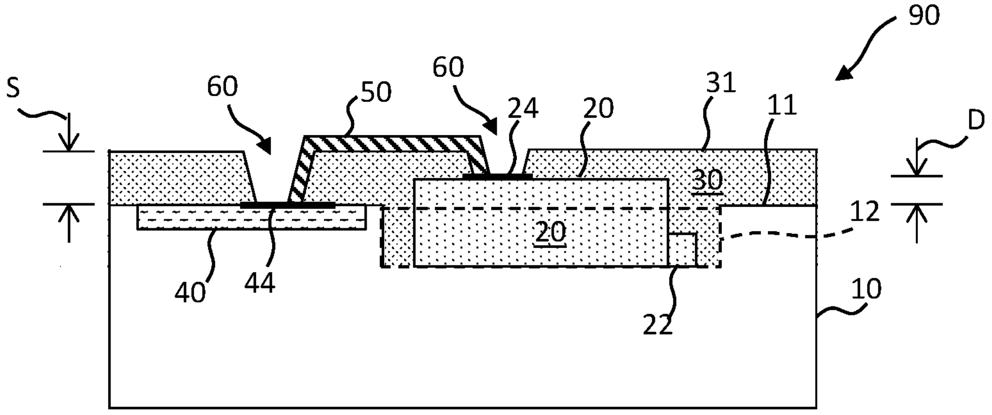

If planarization layer 30 extends over micro-device contact 24, a via 60 can be formed over micro-device contact 24 and if planarization layer 30 extends over substrate contact 44, a via 60 can be formed over substrate contact 44 in step 150 and as shown in FIG. 3E. In step 160 and as illustrated in FIG. 3F, an electrode 50 is patterned over substrate 10 and at least partially over or on planarization layer 30 in electrical contact with micro-device contact 24. Vias 60 and electrodes 50 can be formed using photolithographic methods and materials. In some embodiments, electrode 50 is in electrical contact with substrate contact 44. According to embodiments of the present disclosure, a step height S between a surface 31 of planarization layer 30 and micro-device contact 24 or substrate contact 44 (e.g., a step height of electrode 50) is less than a corresponding step height if micro-device 20 was not disposed in cavity 12, thus enabling improved conductive material deposition over the vertical or steep edges of micro-device 20 or vias 60.

Figure 4:
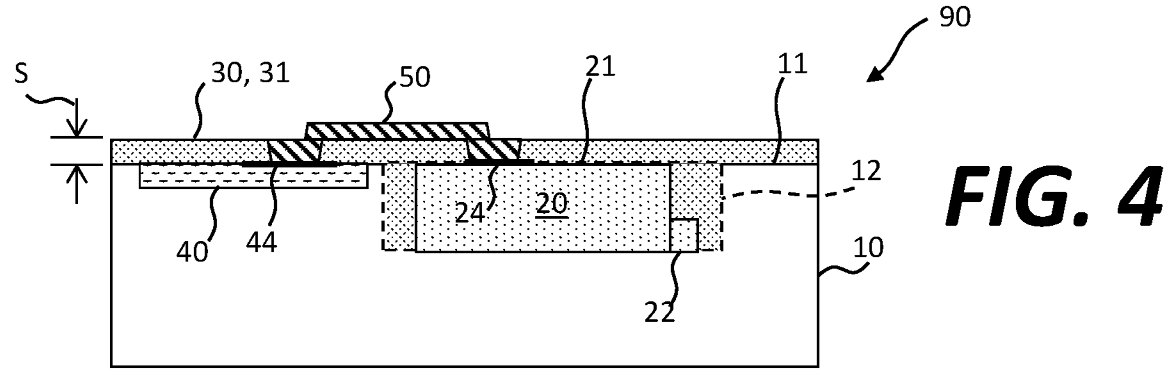
FIGS. 4-5 are cross sections showing cavities of various depths according to illustrative embodiments of the present disclosure.
Figure 5:
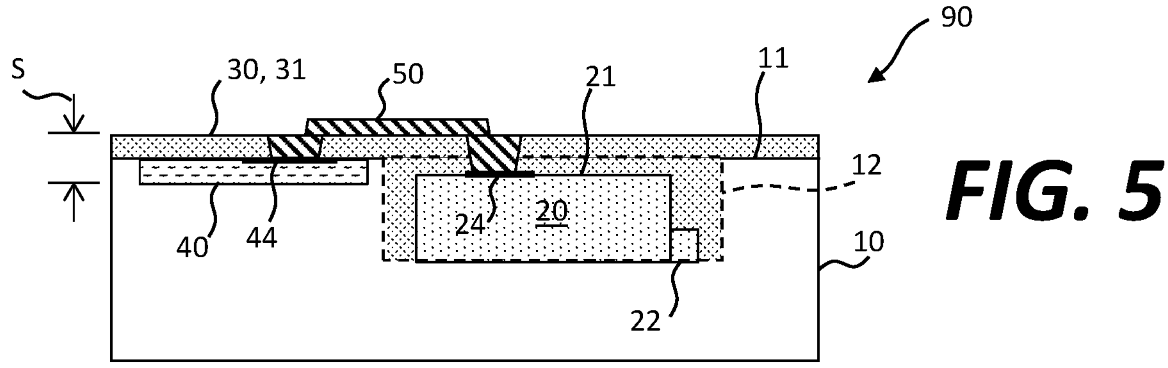

According to embodiments of the present disclosure, cavity 12 can have a depth substantially equal to or within five percent, ten percent, twenty percent, or fifty percent of the thickness of micro-device 20. FIGS. 1A and 3F illustrate embodiments in which cavity 12 has a depth less than a thickness of micro-device 20. FIG. 4 shows micro-device 20 with a thickness substantially equal to the depth of cavity 12 and FIG. 5 illustrates embodiments in which cavity 12 has a depth greater than a thickness of micro-device 20. In all of these embodiments, the largest step height S between planarization layer surface 31 and micro-device contact 24 or substrate contact 44 is less than would be the case if micro-device 20 was not disposed in cavity 12. Micro-device 20 can extend no less than 5 microns, no less than 10 microns, no less than 15 microns, or no less than 20 microns from the substrate surface.

Figure 6:
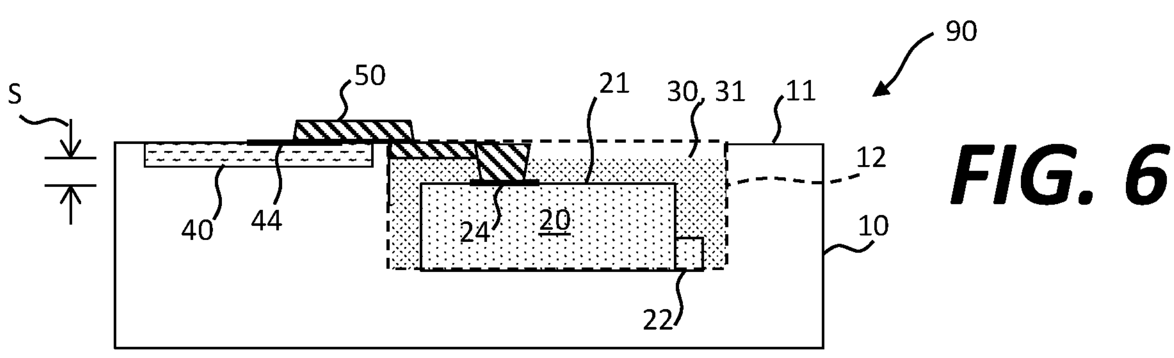
FIG. 6 is a cross section wherein the planarization layer is disposed only in the cavity according to illustrative embodiments of the present disclosure.
Figure 7:
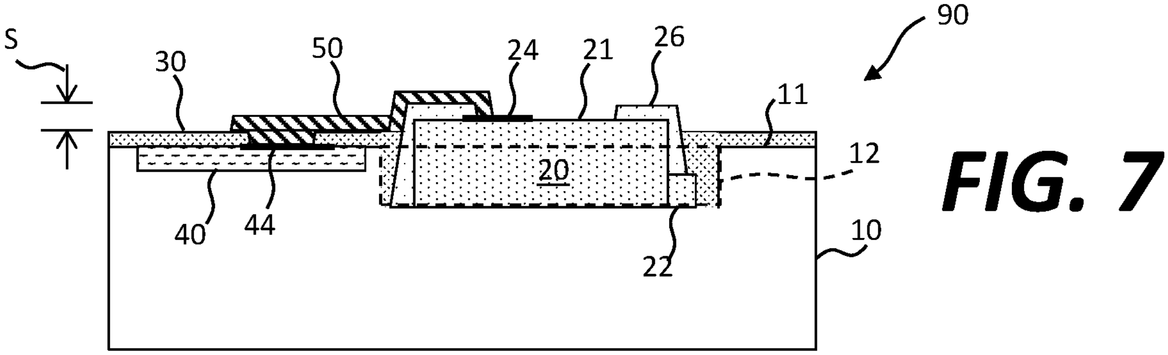
FIG. 7 is a cross section wherein the planarization layer is not disposed over the micro-device according to illustrative embodiments of the present disclosure.

According to embodiments of the present disclosure and as illustrated in FIGS. 1A and 3D-3F, planarization layer 30 can be disposed at least partly in cavity 12. FIG. 6 illustrates embodiments in which planarization layer 30 is disposed mostly or exclusively in cavity 12. FIG. 7 illustrates embodiments in which planarization layer 30 is disposed in cavity 12 and at least partly over substrate surface 11 but not over micro-device top surface 21. Dielectric structures 26 can insulate the edges of micro-device 20 from electrode 50 in the absence of planarization layer 30. Embodiments of the present disclosure comprise planarizing substrate 10 with planarization layer 30 after micro-transfer printing one or more micro-devices 20 from a micro-device source wafer into cavity 12 in substrate 10.

Figure 8:
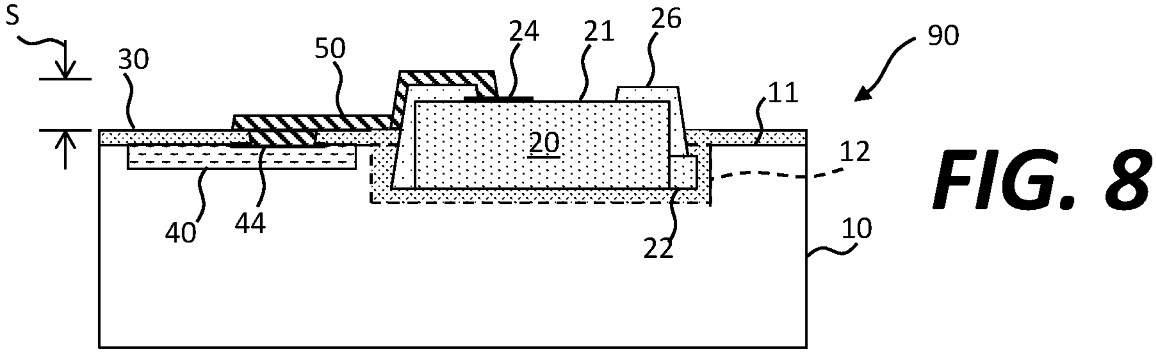
FIG. 8 is a cross section wherein the planarization layer is disposed at least partially beneath the micro-device according to illustrative embodiments of the present disclosure.

FIG. 8 illustrates embodiments in which planarization layer 30 is disposed over substrate surface 11 before micro-device 20 is disposed in cavity 12 so that micro-device 20 is disposed at least partly on planarization layer 30 in cavity 12. Embodiments of the present disclosure comprise planarizing substrate 10 with planarization layer 30 before micro-transfer printing one or more micro-devices 20 from a micro-device source wafer into cavity 12 in substrate 10.

Planarization layer 30 can be disposed at least partially on a sidewall of cavity 12, for example as shown in FIG. 1A and FIG. 8. Planarization layer 30 can have a thickness no greater than a few nanometers, for example, five, ten, twenty, fifty, seventy, or one hundred nanometers. In some embodiments, planarization layer 30 can have a thickness no greater than one, two, five, ten, twenty, fifty, or one hundred microns. In some embodiments, planarization layer 30 has a thickness that is no greater than a thickness of micro-device 20, no greater than a difference between a depth of cavity 12 and thickness of micro-device 20, or no greater than one half, one, two, or five microns than the difference. Dielectric structures 26 can insulate the edges of micro-device 20 from electrode 50 in the absence of planarization layer 30. In such embodiments, step height S is still reduced compared to embodiments in which micro-device 20 is not disposed in cavity 12 or in which planarization layer 30 is absent.

Figure 9:
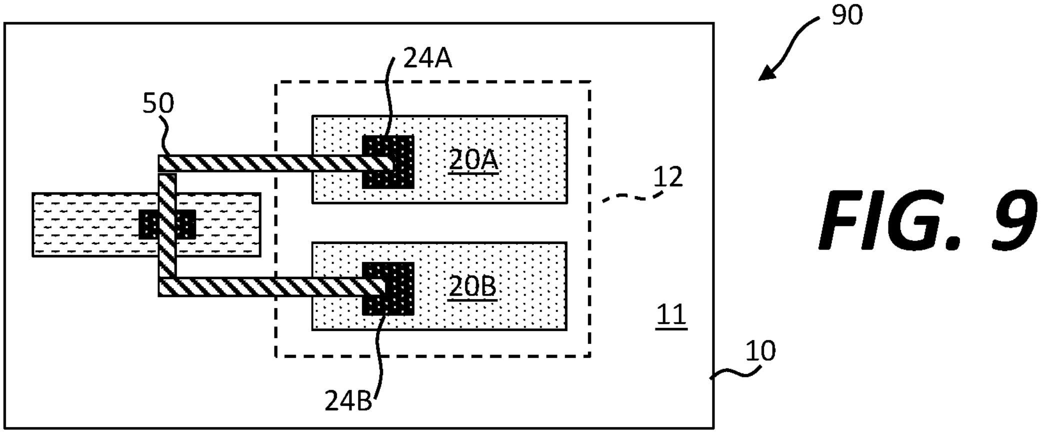
FIG. 9 is a partial plan view excluding the planarization layer with one cavity and two micro-devices according to illustrative embodiments of the present disclosure.
Figure 10A:
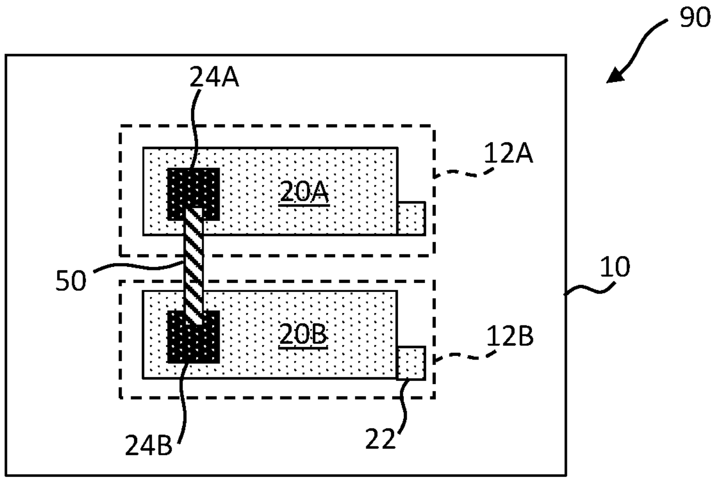
FIG. 10A is a partial plan view excluding the planarization layer with two cavities and two micro-devices according to illustrative embodiments of the present disclosure.
Figure 10B:
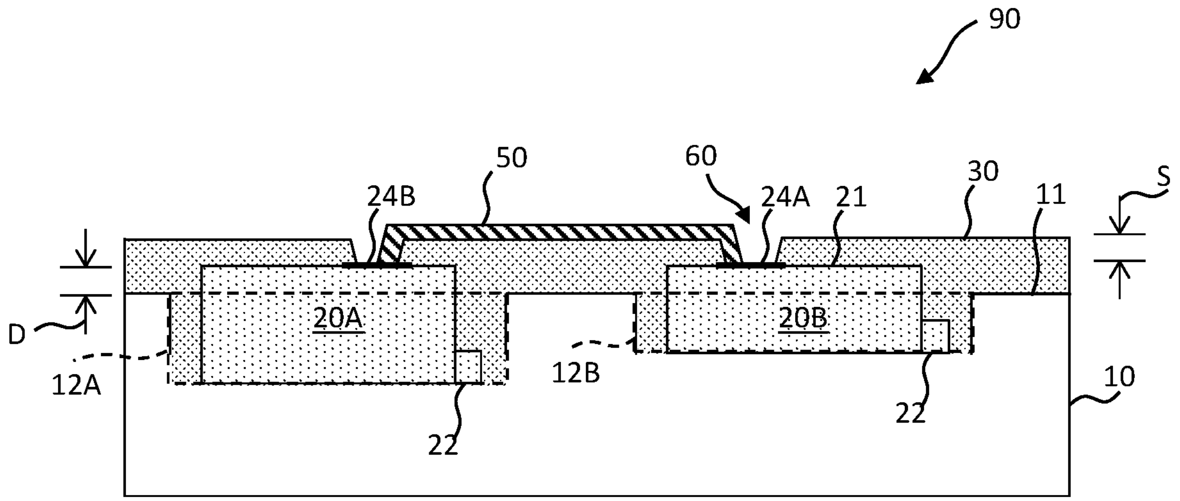
FIG. 10B is a cross section with two cavities having different depths and two micro-devices having the different thicknesses according to illustrative embodiments of the present disclosure.

According to some embodiments of the present disclosure and as illustrated in FIG. 9, two or more micro-devices 20 can be disposed in a common same cavity 12. Electrode 50 can electrically connect micro-device contacts 24 of the two or more micro-devices 20, can electrically connect substrate contact 44 to all or a subset of the two or more micro-devices 20, or both. As shown in FIG. 10A, electrode 50 directly connects two or more micro-devices 20 and, as shown in FIG. 10B, extends over planarization layer 30 but does not pass through a via 60 to substrate surface 11, e.g., as in FIG. 9. For clarity of illustration, FIGS. 9 and 10A omit planarization layer 30 and vias 60. Thus, according to some embodiments of the present disclosure and as shown in FIG. 9, micro-device 20 is a first micro-device 20A, micro-device contact 24 is a first micro-device contact 24A and micro-device structures 90 can comprise a second micro-device 20B disposed in cavity 12. Second micro-device 20B can comprise a second micro-device contact 24B, and electrode 50 can electrically connect first micro-device contact 24A to second micro-device contact 24B.

Figure 10C:
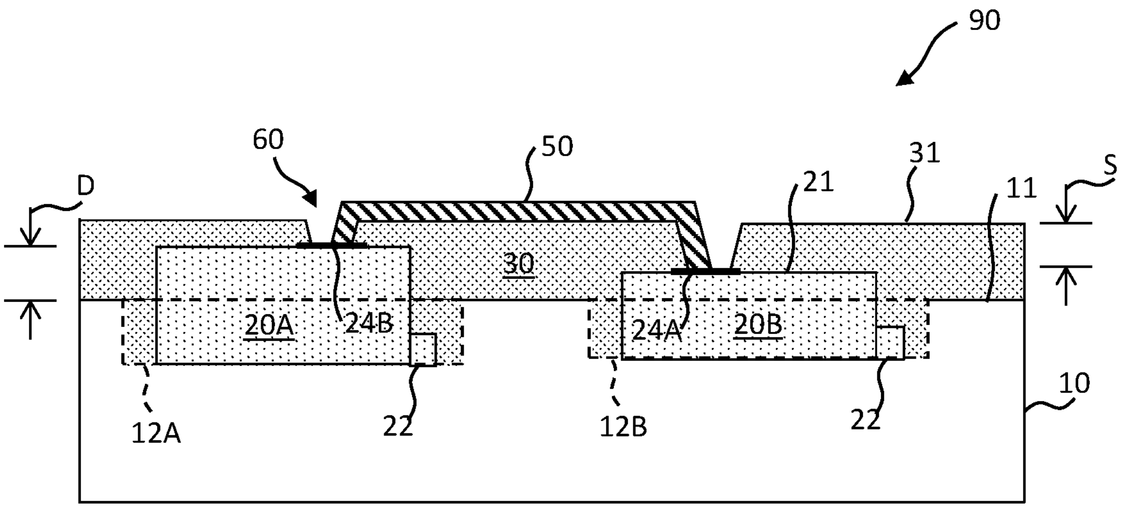
FIG. 10C is a cross section with two cavities having the same depths and two micro-devices having different thicknesses extending different heights above the substrate surface according to illustrative embodiments of the present disclosure.

According to some embodiments of the present disclosure and as illustrated in FIGS. 10A and 10B, two or more micro-devices 20 can each be disposed in a different cavity 12. As shown in FIGS. 10A and 10B, first micro-device 20A with first micro-device contact 24A is disposed in first cavity 12A and second micro-device 20B with second micro-device contact 24B is disposed in second cavity 12B. Electrode 50 electrically connects first micro-device contact 24A to second micro-device contact 24B. Thus, according to embodiments, micro-device 20 is a first micro-device 20A, micro-device contact 24 is a first micro-device contact 24A, cavity 12 is a first cavity 12A and micro-device structures 90 can comprise a second micro-device 20B disposed in a second cavity 12B in substrate 10. Second micro-device 20B comprises a second micro-device contact 24B and electrode 50 electrically connects first micro-device contact 24A to second micro-device contact 24B. Electrode 50 can pass through vias 60 and on or over planarization layer 30. In some embodiments, electrode 50 can pass through a via 60 to a substrate contact 44 (e.g., as shown in FIG. 9) or does not extend to substrate surface 11 (e.g., as shown in FIGS. 10A and 10B). Cavity 12A can have a different depth than cavity 12B or first micro-device 20A can have a different thickness than second micro-device 20B, as shown in FIG. 10B. Such different cavity 12 depths can accommodate micro-devices 20 with different thicknesses to enable reduced step heights for both micro-devices 20 by matching micro-device 20 thickness to cavity 12 depth and thereby reducing step heights in micro-device structure 90. FIG. 10C illustrates embodiments with different-thickness micro-devices 20 with cavities 12 having a same depth.

Thus, according to embodiments of the present disclosure, a micro-device structure 90 comprises a substrate 10 having a substrate surface 11, one or more cavities 12 disposed in substrate 10, each of the cavities 12 extending to substrate surface 11, two or more micro-devices 20, at least one micro-device 20 disposed in each of the one or more cavities 12, each micro-device 20 comprising a micro-device contact 24, and an electrode 50 electrically connecting at least a first micro-device contact 24A of a first micro-device 20A and a second micro-device contact 24B of a second micro-device 20B. As shown in FIG. 9, two or more micro-devices 20 can be disposed in one cavity 12. As shown in FIGS. 10A and 10B, the one or more cavities 12 can comprise at least two cavities 12 with a micro-device 20 disposed in each of the at least two cavities 12. As shown in FIG. 10C, in some embodiments, a first cavity 12A of the one or more cavities 12 extends a first distance into substrate 10, a second cavity 12B of the one or more cavities 12 extends a second distance into substrate 10, and the first distance is different from the second distance so that first and second cavities 12A, 12B have different depths. In some embodiments, a first micro-device 20A of the two or more micro-devices 20 has a first thickness, a second micro-device 20B of the two or more micro-devices 20 has a second thickness, and the first thickness is different from the second thickness so that first and second micro-devices 20A, 20B have different depths. A planarization layer 30 can be disposed over at least a portion of substrate 10, in cavity 12, or on or over micro-device 20. A substrate contact 44 can be disposed on or in substrate surface 11 and electrode 50 can be electrically connected to substrate contact 44. In embodiments of the present disclosure, a top surface 21 of micro-device 20 can be separated from substrate surface 11 by a distance no greater than five microns, no greater than three microns, no greater than two microns, no greater than one micron, or no greater than five hundred nm in a direction orthogonal to substrate surface 11. Micro-device 20 can comprise a separated or fractured tether 22.

Figure 11A:
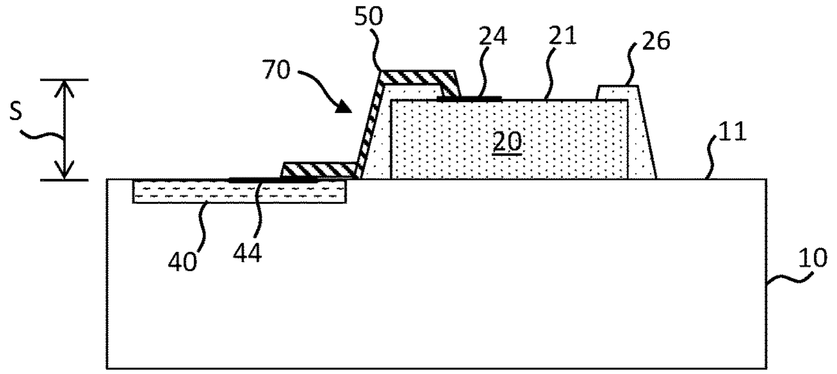
FIG. 11A is a cross section of a micro-device on a substrate without a cavity and without a planarization layer useful in understanding embodiments of the present disclosure.
Figure 11B:
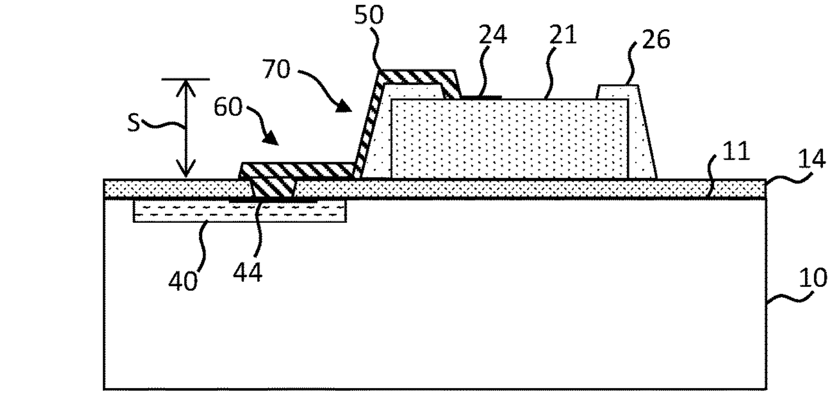
FIG. 11B is a cross section of a micro-device on a substrate without a cavity and with an adhesive layer between the micro-device and the substrate useful in understanding embodiments of the present disclosure.
Figure 12:
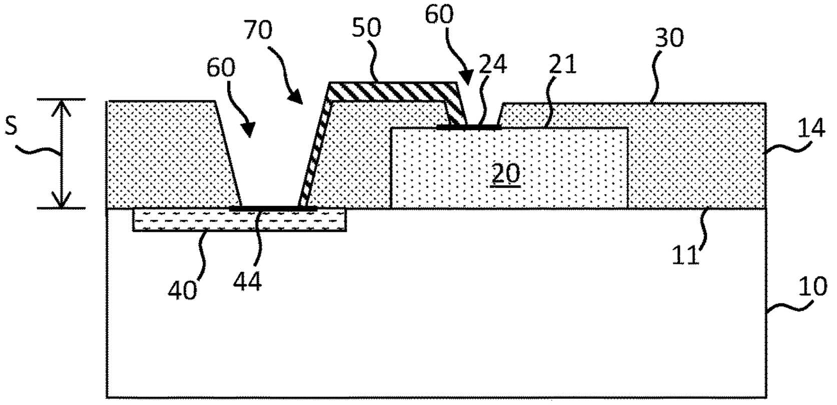
FIG. 12 is a cross section of a micro-device on a substrate without a cavity and with a planarization layer useful in understanding embodiments of the present disclosure.

FIGS. 11A, 11B, and 12 illustrate structures that do not use cavities 12. As shown in FIG. 11A, a micro-device 20 disposed on substrate surface 11 of substrate 10 with a substrate contact 24 electrically connected with electrode 50 to substrate contact 44 on substrate 10 has a relatively large step height S. Similarly, as shown in FIG. 11B, a micro-device 20 disposed on a relatively thin adhesive layer 14 on substrate surface 11 of substrate 10 with a substrate contact 24 electrically connected with electrode 50 to substrate contact 44 through via 60 on substrate 10 also has a relatively large step height S. As shown in FIG. 12, a micro-device 20 disposed on a relatively thick planarizing adhesive layer 14 on substrate surface 11 of substrate 10 with a substrate contact 24 electrically connected with electrode 50 to substrate contact 44 through via 60 on substrate 10 has a relatively large step height S. The relatively large step height S (e.g., no less than five or no less than ten microns) can have relatively poor conductive material coverage 70 for electrode 50, reducing electrode 50 conductivity, as shown in FIGS. 11A-12. Thus, embodiments of the present disclosure comprising micro-device 20 disposed in cavity 12 have a reduced step height S and improved electrical connections.

Micro-device structures according to embodiments of the present disclosure can comprise a substrate 10 having a substrate surface 11, a cavity 12 extending into substrate 10 from substrate surface 11, a micro-device 20 disposed in cavity 12, and a planarization layer 30 disposed over at least a portion of substrate 10 in contact with micro-device 20. Planarization layer 30 can be a cavity-filling layer and need not planarize the entire substrate surface 11. At least a portion of micro-device 20, e.g., a portion or only a portion of micro-device top surface 21 can be exposed and planarization layer 30 can extend into cavity 12, can contact a cavity side 13 of cavity 12, can extend over only a portion of micro-device 20, e.g., only a portion of micro-device top surface 21, can contact a micro-device side 23 of micro-device 20, or any combination of these. As shown in FIG. 1, a micro-device structure of claim 1 can comprise a via 60 formed through planarization layer 30 that exposes a portion of substrate surface 11 or exposes a layer or structure disposed on substrate surface 11, for example a substrate contact 44.

Figure 13:
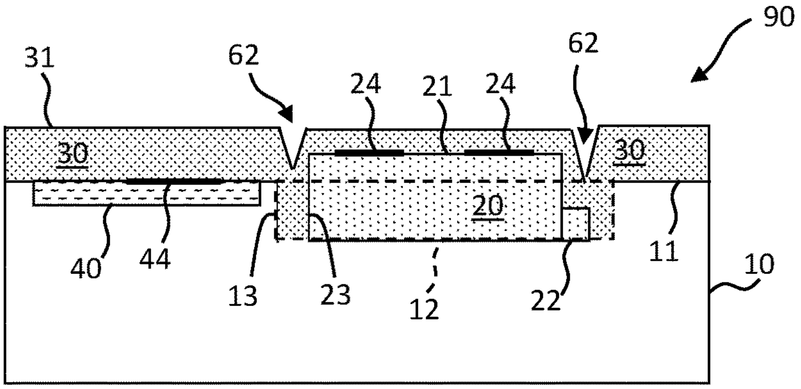
FIG. 13 is a cross section of a micro-device on a substrate in a cavity with a planarization layer having a pit or a trench according to illustrative embodiments of the present disclosure.
Figure 14A:
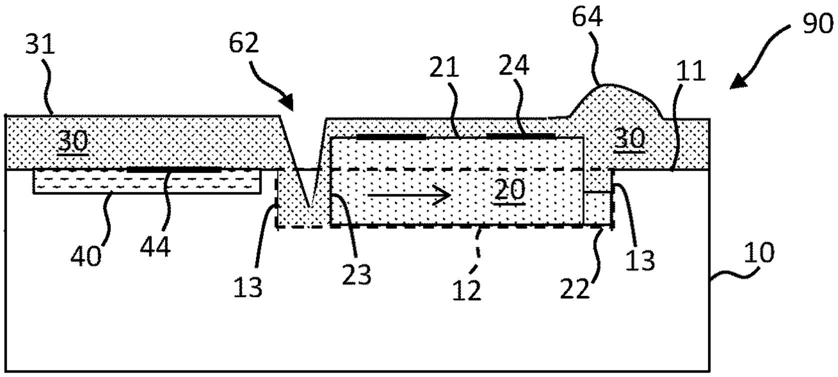
FIGS. 14A and 14B are cross sections of a micro-device on a substrate in a cavity with a planarization layer having a pit or trench and a protuberance according to illustrative embodiments of the present disclosure.
Figure 14B:
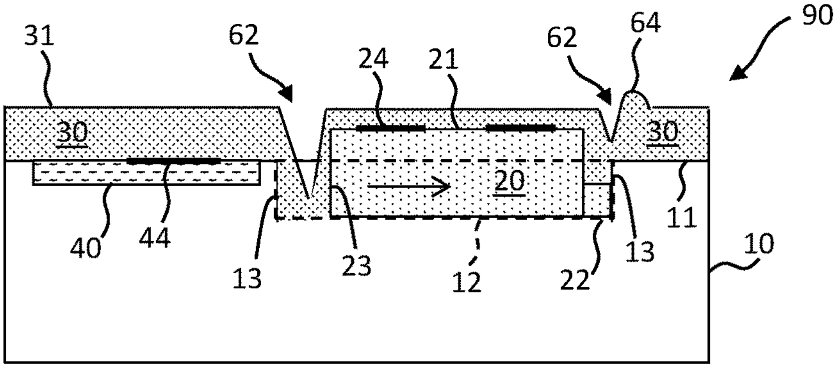
Figure 14C:
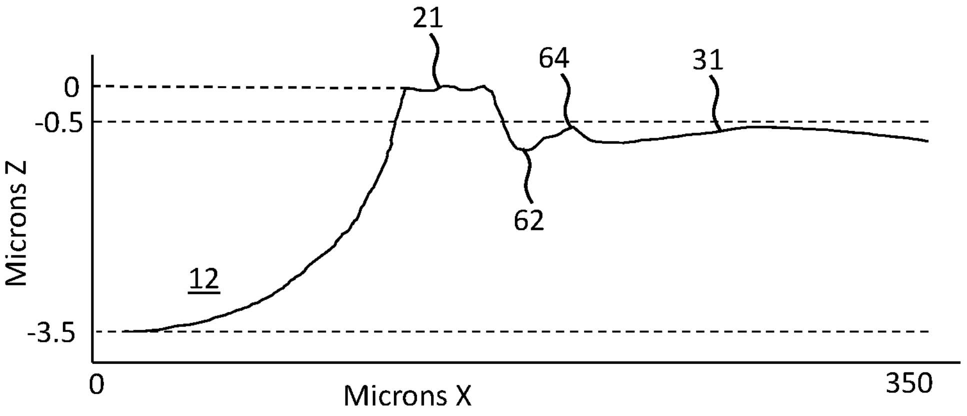
FIG. 14C is a profilometer graph of the surface of a substrate and a micro-device printed into a cavity without offset shear corresponding to the right side surface of FIG. 14B useful in understanding embodiments of the present disclosure.

Planarization layers 30 disposed over substrates 10 and micro-devices 20 disposed in cavities 12 can be coated using, for example, spin coating or spray coating. However, it is possible that the coated planarization layer is not in fact locally planar in the region of cavity 12, especially when planarization layer 20 is relatively thin, for example no greater than five microns, no greater than two microns, no greater than one micron, no greater than 0.5 microns, or no greater than 0.2 microns. As shown in FIG. 13, material of planarization layer 30 can flow into cavity 12 and form a pit 62 (e.g., a dent, dip, or trench adjacent to micro-device 20 or cavity 12 or surrounding micro-device 20 or withing cavity 12) on one or more sides of micro-device 20, for example due to energy imparted to the material of planarization layer 30 by spinning, gravity, or surface energy. For example, pit 62 can be an indentation in a surface of planarization layer 30 that extends along a portion or all of one or more micro-device sides 23 (e.g., a micro-device 20 edge) or around micro-device 20 and can be in or above cavity 12, for example along a cavity side 13 (e.g., a cavity 12 edge). As shown in FIG. 14A, the step of printing micro-device 20 in cavity 12, for example with offset shear to break the bond between micro-device 20 and a print stamp used for micro-transfer printing as indicated by the arrows in FIGS. 14A and 14B, or micro-device 20 movement due to surface energy or planarization layer 30 material flow can also form a protrusion 64 (e.g., a bump, extrusion, prominence, protuberance or extension) of planarization layer 30 material that can extend above a desired planar surface of planarization layer 30 in a direction opposite substrate 10. Micro-device 20 movement can also increase the size of pits 62 on a trailing edge micro-device side 23, as shown in FIGS. 14A, 14B. Both pits 62 and protrusions 64 can be present in a planarization layer 30, as shown in FIG. 14A. Any movement of micro-device 20 that forms a protrusion 64 can also increase the size of pit 62, as shown. FIG. 14B illustrates a structure in which a pit 62 and a protrusion 64 are present on a common micro-device side 23 and cavity side 13, as shown in the measured profile of FIG. 14C. The graph of FIG. 14C shows a height (Z direction) of planarization layer 30 over substrate surface 11 with respect to planarization layer surface 31 and, for clarity, has a grossly compressed X axis relative to the Z direction. Thus, according to some embodiments, planarization layer 30 can comprise a pit 62 adjacent to micro-device 20 or a protrusion 64 adjacent to or over micro-device 20. However, any pits 62 or protrusions 64 can form steep edges in planarization layer 30 that can cause reduced (e.g., poor) electrode coverage 70, for example when using a blanket or patterned deposition.

Figure 15:
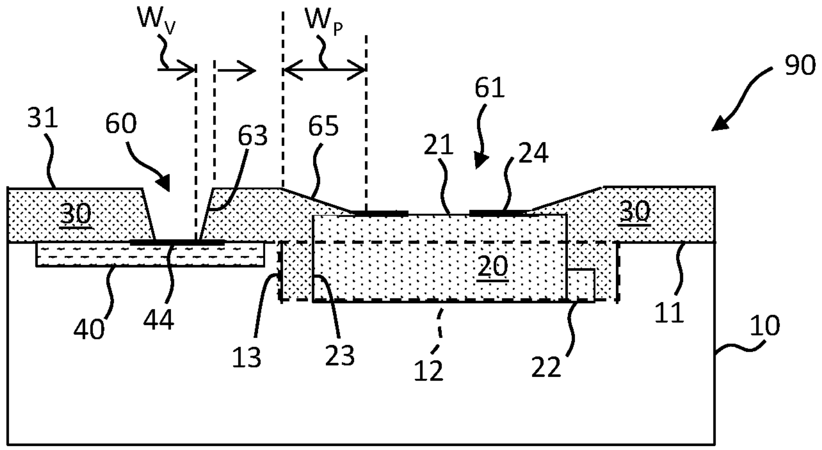
FIG. 15 is a cross section of a micro-device on a substrate in a cavity with a low-resolution planarization layer via and a high-resolution planarization layer via corresponding to the structure of FIG. 13 according to illustrative embodiments of the present disclosure.
Figure 16:
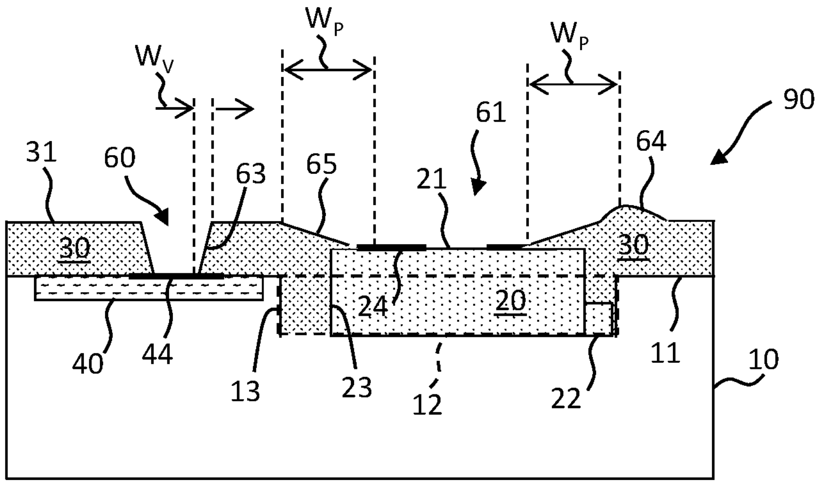
FIG. 16 is a cross section of a micro-device on a substrate in a cavity with a low-resolution planarization layer via and a high-resolution planarization layer via corresponding to the structure of FIGS. 14A and 14B according to illustrative embodiments of the present disclosure.

Reduced (e.g., poor) electrode coverage 70 can be mitigated or prevented, according to embodiments of the present disclosure and as shown in FIGS. 15 and 16, by providing one or more relatively low-spatial resolution vias 61 (low-resolution via 61) over micro-device 20 or one or more micro-device sides 23 or one or more cavity edges 12. Low-spatial resolution vias 61 can be lower resolution than vias 60 used to expose substrate 10 or substrate surface 11, for example substrate contacts 44 on substrate surface 11. Low-spatial resolution vias 61 can extend from at least a portion of a micro-device top surface 21 of micro-device 20 to substrate surface 11, thereby reducing the extent or depth of pits 62 or the extent or height of protrusions 64 and enabling improved electrode coverage. Desirably, embodiments of the present disclosure provide high-resolution vias 60, for example to substrate contacts 44 to enable a high density of electrical connections over substrate 10, and low-resolution vias 61 to enable good step coverage for electrodes electrically connected to micro-device contacts 24 on micro-device top surface 21 of micro-device 20 in cavity 12. Cavity 12 reduces the step height of micro-device top surface 21 over substrate surface 11 further mitigating step coverage issues.

Thus, according to embodiments of the present disclosure and as shown in FIG. 15, planarization layer 30 has a planarization layer surface 31 on a side of planarization layer 30 opposite substrate 10 and micro-device 20 has a micro-device top surface 21 on a side of micro-device 20 opposite substrate 10. Via 60 has a substrate via side width $W_V$ that extends from planarization layer surface 31 to substrate surface 11 or to any layer or structure formed on substrate surface 11. Similarly, planarization layer 30 has a device via side width $W_P$ that extends from planarization layer surface 31 to micro-device top surface 21. Device via side width $W_P$ is greater than substrate via side width $W_V$.

Via 60 has a via edge that extends from planarization layer surface 31 to substrate surface 11 or to any layer or structure formed on substrate surface 11 and the via edge has an average via slope with respect to substrate surface 11.

Low-spatial resolution via 61 has a planarization edge of planarization layer 30 with an average micro-device planarization slope with respect to substrate surface 11. The via slope is greater than the micro-device planarization slope, e.g., the via slope is steeper than the micro-device planarization slope so that via 60 has a higher spatial resolution than low-spatial resolution via 61.

FIG. 15 illustrates a low-spatial resolution via 61 formed in planarization layer 30 shown in FIG. 13 and FIG. 16 illustrates a low-spatial resolution via 61 formed in planarization layer 30 shown in FIGS. 14A and 14B, both with a high-resolution planarization via 60 disposed over substrate contact 44.

Figure 17:
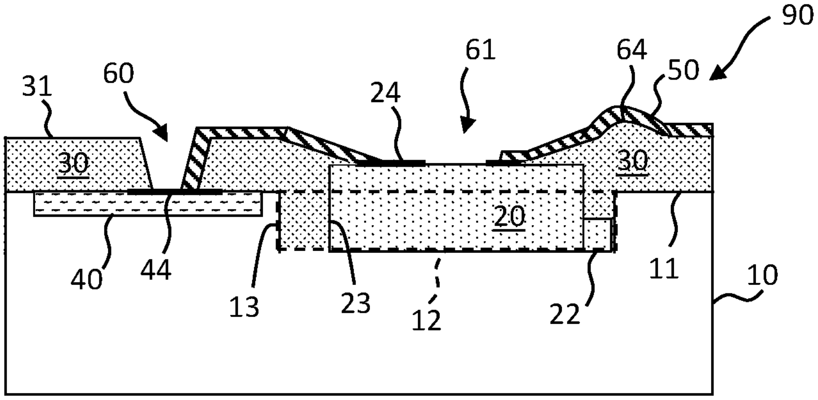
FIG. 17 is a cross section of a micro-device on a substrate in a cavity with a patterned electrode disposed on the planarization layer corresponding to the structure of FIG. 16 according to illustrative embodiments of the present disclosure.

Embodiments of the present disclosure include a wide variety of high-resolution vias 60, low-resolution vias 61, substrate contacts 44, and micro-device contacts 24. In some embodiments, micro-devices 20 can comprise multiple micro-device contacts 24 that are exposed by a common low-resolution via 61, for example as shown in FIGS. 15 and 16 so that planarization layer 30 extends over only a portion of a surface of micro-device 20 opposite substrate 10 (e.g., micro-device top surface 21). By providing a low-resolution via 61, even if micro-device 20 is mis-registered with respect to its intended location and a mask defining vias 60, at least some portion of micro-device contacts 24 can be exposed and can be electrically connected with an electrode 50, as shown in FIG. 17, despite the mis-registration. Thus, in some embodiments, micro-device 20 comprises a first micro-device contact 24 and a second micro-device contact 24, both disposed on micro-device top surface 21 of micro-device 20 opposite substrate 10. A first portion of first micro-device contact 24 is exposed through planarization layer 30, a second portion of second micro-device contact 24 is exposed through planarization layer 30, and the first portion is larger than the second portion, for example because of the relative mis-registration of a mask with respect to micro-device 20 on substrate 10.

In some embodiments, a side of micro-device 20 non-parallel to substrate surface 11 (e.g., a vertical micro-device side 23 or edge) is closer to a side of cavity 12 non-parallel to substrate surface 11 (e.g., a vertical cavity side 13 or edge) than any other side of micro-device 20 non-parallel to the substrate surface. Thus, micro-device 20 can be printed closely adjacent to or pushed toward a side of cavity 12. In some embodiments, a side of micro-device 20 is in contact with a side of cavity 12 or is within one micron of the side of cavity 12. In some embodiments, two sides of micro-device 20 non-parallel to the substrate surface are closer to two sides of cavity 12 non-parallel to substrate surface 11 than any other sides of micro-device 20 non-parallel to substrate surface 11, for example where micro-device 20 is disposed closely adjacent to or in contact with a corner of cavity 12. In some such embodiments, a center of micro-device 20 is not necessarily congruent with a center of cavity 12 so that micro-device 20 is offset within and with respect to cavity 12 rather than centered within cavity 12.

In some embodiments, micro-device 20 extends beyond (e.g., sticks up or protrudes through planarization layer 30, e.g., as shown in FIGS. 8, 11A, and 11B. For example, a surface of micro-device 20 opposite substrate 10 (e.g., micro-device top surface 21) extends farther from substrate surface 11 than a surface of planarization layer 30 opposite substrate 10 (e.g., planarization layer surface 31). In some embodiments, planarization layer 30 extends over micro-device 20, as shown in FIGS. 1A and 14A-17. For example, a surface of planarization layer 30 opposite substrate 10 (e.g., planarization layer surface 31) can extend farther from substrate surface 11 than a surface of micro-device 20 opposite substrate 10 (e.g., micro-device top surface 21). Thus, in some such embodiments, a surface of micro-device 20 opposite substrate 10 (e.g., micro-device top surface 21) is below a surface of planarization layer 31 with respect to substrate 10.

In some embodiments, micro-device 20 does not extend over the top of cavity 12 (e.g., does not extend above substrate surface 11 or planarization layer surface 31) as shown in FIGS. 5 and 6 so that micro-device 20 is entirely within cavity 12. In some embodiments, micro-device 20 is only partly within cavity 12 and extends above cavity 12 with respect to substrate 10, for example as shown in FIGS. 14A-17.

In general, and according to some embodiments of the present disclosure, a substrate structure comprises a substrate 10 having a substrate surface 11 and a patterned cured layer (e.g., planarization layer 30) disposed on and in contact with substrate surface 11, the patterned cured layer having a layer surface (e.g., planarization layer surface 31) on a side of the patterned cured layer opposite substrate surface 11. A first portion of the patterned cured layer covers a first portion of substrate surface 11 (e.g., covers substrate circuit 40) and a second portion of the patterned cured layer covers a second portion of substrate surface 11 (e.g., covers cavity 12 or at least a portion of micro-device 20 or another portion of substrate 10). A first via 60 extends from the layer surface to the substrate surface in the first portion and a second low-resolution via 61 extends from the layer surface to substrate surface 11 or a structure (e.g., cavity 12 or micro-device 20) disposed on or in substrate 10 in the second portion. The first via has a first substrate via side width $W_V$ (e.g. substrate via side width $W_V$) and the second via has a second via side width $W_P$ (e.g., device via side width $W_P$) greater than the first via side width $W_V$ so that a slope of the first via 60 is greater than a slope of the second via 61.

In some embodiments of the present disclosure, micro-devices 20 can be micro-transfer printed from a micro-device 20 source wafer into cavities 12. In some embodiments, a single micro-device 20 is disposed in each cavity 12. In some embodiments, multiple micro-devices 20 are disposed in each cavity 12. As a consequence of micro-transfer printing, micro-devices 20 can comprise a broken (e.g., fractured) or separated micro-device tether 22 or is a bare, unpackaged die, or both. Micro-transfer printing enables very small micro-devices, e.g., having a length or width, or both, no greater than 100, 50, 20, 10, 5, or 3 microns and, alternatively or additionally, a thickness no greater than 50, 20, 10, 5, or 2 microns, into a cavity of similar, but slightly larger, size. Prior methods, such as pick-and-place for surface mount components cannot dispose such small devices into such small cavities. Thus, some embodiments of the present disclosure enable a significant reduction in size (e.g., at least a factor of 10 in each dimension) for electronic or opto-electronic components with a consequent reduction in parasitic resistance, capacitance, and inductance, and an increase in heat removal.

Figure 18:
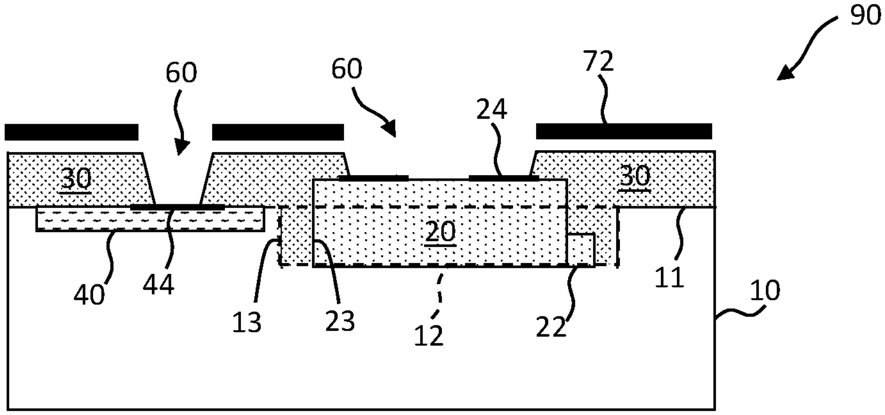
FIG. 18 is a cross section of a micro-device on a substrate in a cavity with a desirable planarization layer and a properly located patterned mask useful for understanding embodiments of the present disclosure.
Figure 19:
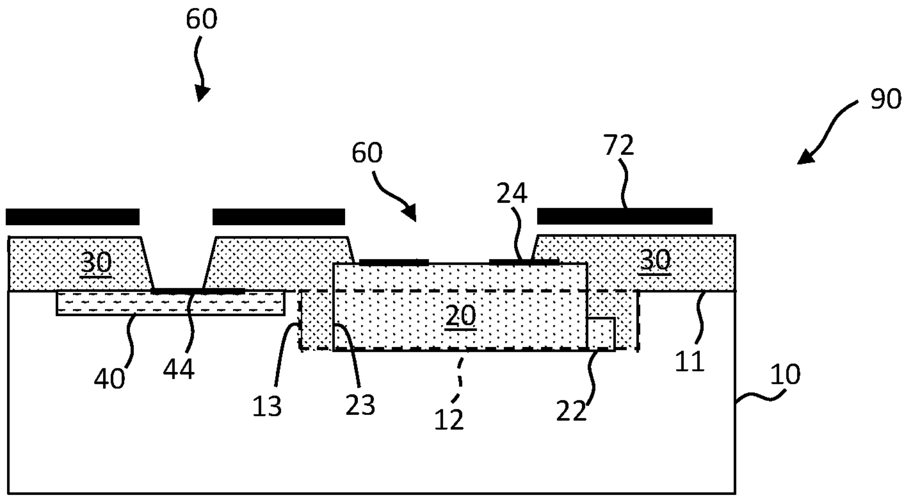
FIG. 19 is a cross section of a micro-device on a substrate in a cavity with a desirable planarization layer and a misaligned patterned mask useful for understanding embodiments of the present disclosure.
Figure 20:
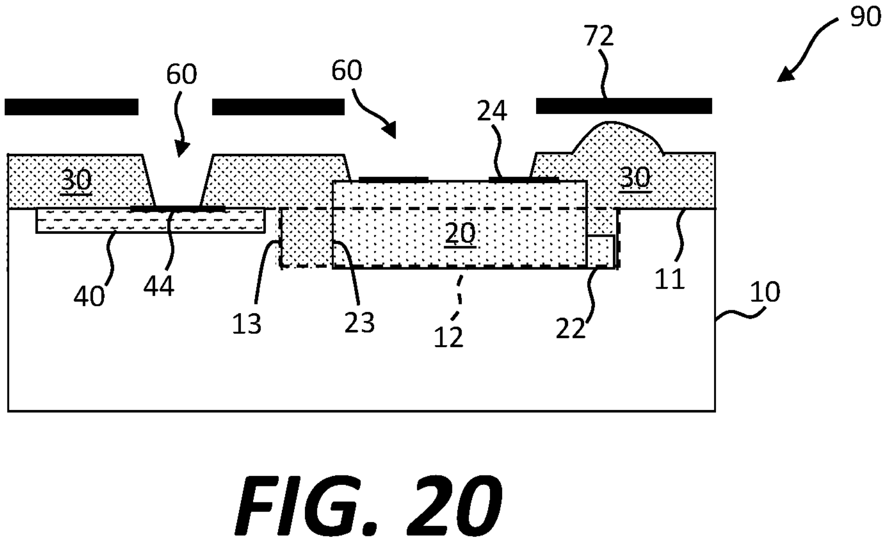
FIG. 20 is a cross section of a micro-device on a substrate in a cavity with a desirable planarization layer and a misaligned micro-device useful for understanding embodiments of the present disclosure.

FIG. 18 illustrates a mask 72 disposed over and properly aligned with micro-device 20 and substrate contact 44 to form vias 60. However, in some embodiments of the present disclosure, mask 72 is misaligned with micro-device 20 (e.g., on the order of 1-5 microns) and substrate contact 44, for example as shown in FIG. 19, or micro-device 20 is misaligned with mask 72, for example as shown in FIG. 20, or both, and vias 60 are therefore misplaced. Moreover, as shown in FIGS. 14A and 14B, planarization layer 30 can have pits 62 or protrusions 64 when planarizing micro-devices 20 in cavities 12. There is a need, therefore, for a way to overcome mask misalignment (mis-registration) and pits 62 or protrusions 64 in planarization layer 30 to form electrodes 50 with good coverage and conductivity over a suitable step-height and via slope.

Figure 21:
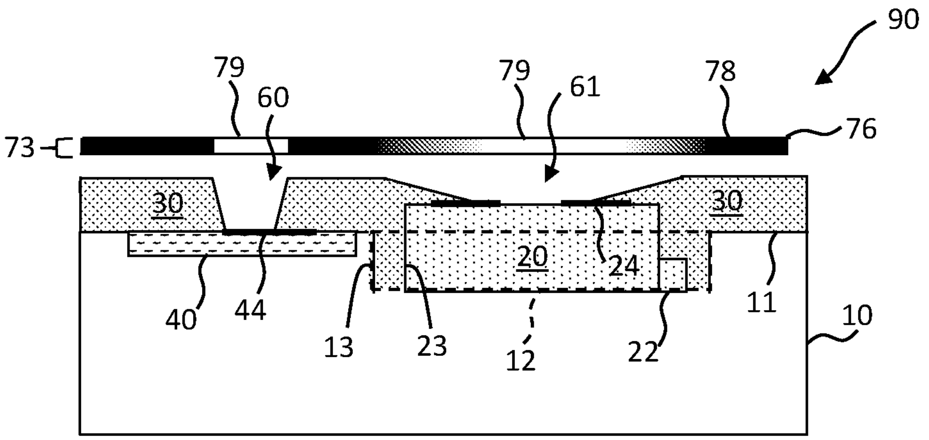
FIG. 21 is a cross section of a micro-device on a substrate in a cavity with a dithered mask corresponding to FIG. 19 according to illustrative embodiments of the present disclosure.
Figure 22:
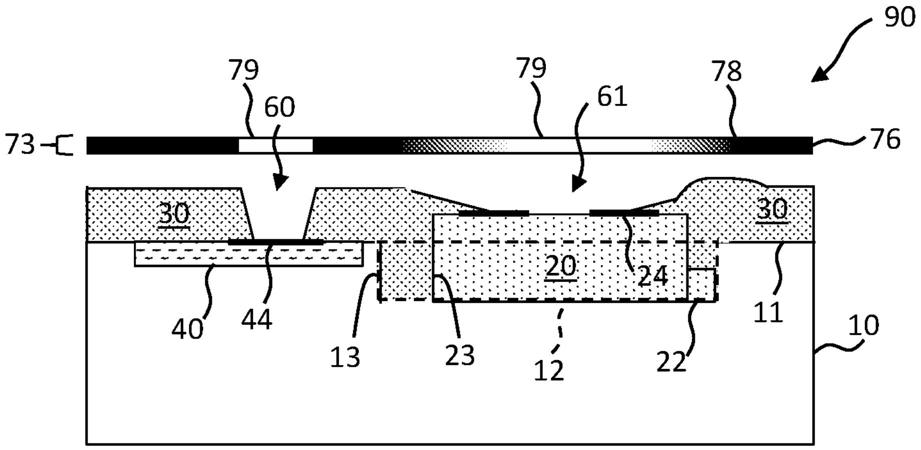
FIG. 22 is a cross section of a micro-device on a substrate in a cavity with a dithered mask corresponding to FIG. 20 according to illustrative embodiments of the present disclosure.

According to some embodiments of the present disclosure, forming a low-resolution via 61 over micro-device 20, micro-device sides (edges) 23, cavity 12, or cavity sides (edges) 13 can mitigate or eliminate difficulties in forming electrodes 50 over micro-device 20, micro-device sides 23, cavity 12, or cavity sides 13 with effective deposition thickness and conductivity. Such low-resolution vias can be constructed using dithered masks 73. According to some embodiments and as shown in FIGS. 21, 22, 26, and 27, dithered masks 73 comprise a mask material (e.g., mask substrate 76) that is variably transparent with dark area(s) 78 that substantially absorb or reflect electromagnetic radiation (e.g., ultraviolet or visible light) (e.g., sufficiently opaque as to prevent an effective dose of electromagnetic radiation from passing through, for example at least 90% opaque), light area(s) 79 that are substantially transparent to electromagnetic radiation (e.g., sufficiently transparent as to allow an effective dose of electromagnetic radiation to pass through, for example at least 90% transparent), and area(s) that are partially transparent and absorb less electromagnetic radiation than dark areas 78 and more electromagnetic radiation than the light areas 79. A variably transparent mask must thus have at least three areas that have different transparencies. A variably transparent mask (e.g., dithered mask 73) material can comprise dyes, pigments, or varying concentrations of light-absorbing material, such as black particles (e.g., carbon black or chromium) corresponding to the desired mask pattern, e.g., as shown in FIGS. 21, 22, and 27. Thus, low-resolution transition areas of dithered masks 73 can comprise a variable density of electromagnetic-radiation-absorbing material or electromagnetic-radiation-reflecting material in mask substrate 76.

Figure 26:
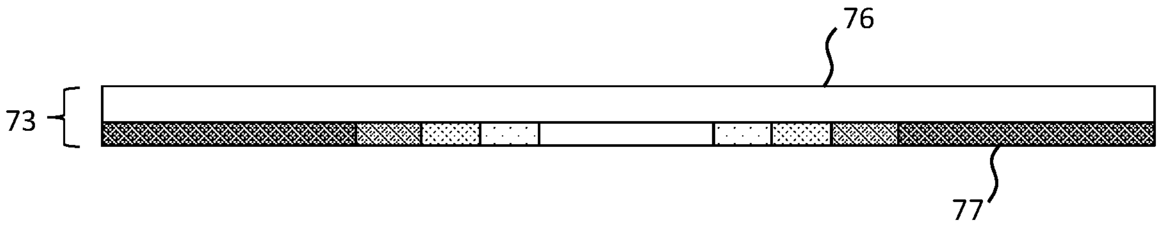
FIG. 26 is a cross section of a dithered mask with a mask substrate and dithered mask film according to illustrative embodiments of the present disclosure.

In some embodiments and as shown in FIG. 26, dithered mask 73 can comprise a substantially transparent mask substrate 76 coated with a variably electromagnetic-radiation-absorbing dithered film 77, for example comprising different amounts of black chrome or different density coatings of carbon black, corresponding to the desired mask pattern.

In some embodiments and as shown in FIGS. 27A-27D, the coating density in areas that comprise electromagnetic-radiation-absorbing is constant, but the low-resolution transition areas comprise a pattern of one or more structures that have a variable spatial density of a constant amount of electromagnetic-radiation-absorbing material in the mask substrate 76. Thus, dithered masks 73 can have changing relative areas of radiation-absorbing material disposed over or in mask substrate 76, for example using half-toning structures such as lines with varying widths, areas having curved edges, dots, or rectangles, squares, triangles or other polygons whose light-absorbing area changes over mask substrate 76. The structures can change in size and in frequency of occurrence over mask substrate 76. For example, patterns shown in FIGS. 27A-27C can have different numbers of differently sized light-absorbing material shapes extending in one dimension (e.g., circles, triangles, or lines) or extending in two dimensions, as shown with squares in FIG. 27D.

Thus, according to some embodiments of the present disclosure, a variable-resolution photolithographic mask (e.g., dithered mask 73) comprises a mask substrate 76 having one or more dark areas 78 that are relatively opaque to electromagnetic radiation and one or more light areas 79 that are relatively transparent to electromagnetic radiation, the mask substrate 76 having one or more spatial areas of transparency transition from one of the dark areas 78 to one of the light areas 79. At least one of the spatial areas of transparency transition comprises a high-resolution transition area that changes from relatively opaque to relatively transparent in a first spatial distance and a low-resolution transition area that changes from relatively opaque to relatively transparent in a second spatial distance greater than the first spatial distance in either one or two dimensions.

Figure 25:
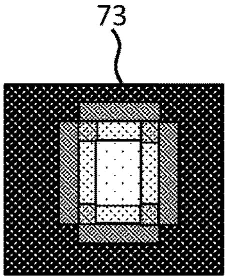
FIG. 25 is a plan view of a dithered mask according to illustrative embodiments of the present disclosure.

The variation in light absorption can be continuous, for example as shown in FIGS. 21 and 22 or can be step-wise or discontinuous with different areas of constant absorption of different amounts, for example as shown in FIGS. 26, 28 and 27A-27D. The variation in radiation absorption can be in one dimension across the mask (e.g., with lines of constant absorption orthogonal to the direction of variation, shown in FIGS. 27A-27C) or in two dimensions (e.g., with circles or rectangles of constant absorption) as shown in the plan view of FIG. 25 and FIG. 27D.

When disposed over an undeveloped planarization layer 30 and exposed to electromagnetic radiation, dithered mask 73 allows variable amounts of radiation to expose planarization layer 30. If planarization layer 30 is a positive photoresist, the exposure will variably degrade the photoresist material in the area exposed to the variable amount of radiation. If planarization layer 30 is a negative photoresist, the exposure will variably strengthen the photoresist material in the area exposed to the variable amount of radiation, e.g., by polymerization or cross linking. When planarization layer 30 is subsequently exposed to a developer, the weak areas of planarization layer 30 wash away. According to some embodiments of the present disclosure, planarization layer 30 can be either a positive or a negative photoresist can be used with a correspondingly patterned dithered mask 73. Because the amount of photoresist material degradation or strengthening varies relatively gradually compared to the conventional binary pattern (either as opaque as possible or as transparent as possible), when planarization layer 30 is developed, the planarization layer 30 thickness gradually changes. For clarity, the Figures show structures and methods using a positive photoresist, but embodiments of the present disclosure are not limited to such and embodiments using negative photoresists are analogously contemplated.

Figure 23:
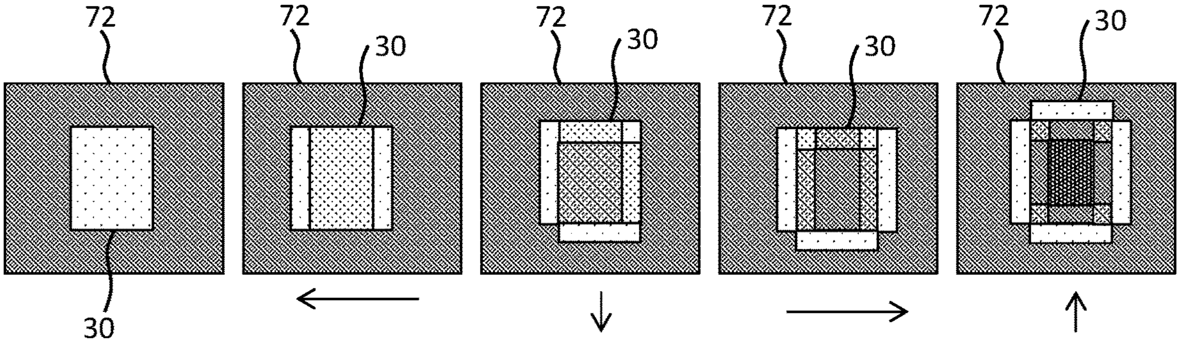
FIG. 23 is a plan view of a mask forming a two-dimensional dithered structure in two-dimensional offset locations on a planarization layer according to illustrative embodiments of the present disclosure.
Figure 24:
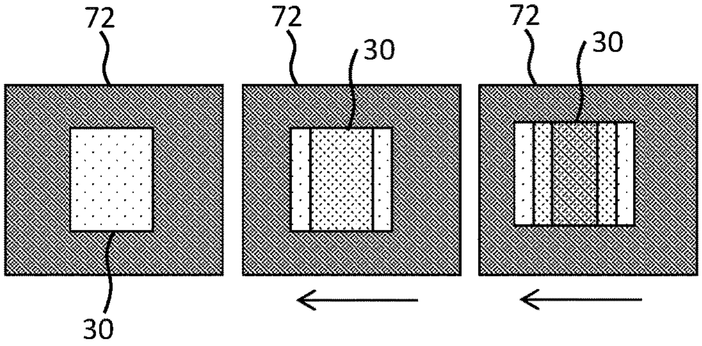
FIG. 24 is a plan view of a mask forming a one-dimensional dithered structure in one-dimensional offset locations on a planarization layer according to illustrative embodiments of the present disclosure.

According to some embodiments, a dithered mask 73 is a binary mask 30 that provides a dithered exposure to planarization layer 30 by moving dithered mask 30 over planarization layer 30 and performing multiple exposures where the multiple exposures expose at least one portion of planarization layer 30 every time. Thus, different portions of planarization layer 30 will be exposed by different amounts that, when developed form a variable-thickness planarization layer 30. FIG. 23 illustrates a temporally progressive exposure of a binary mask opening (movements are described with respect to the central, initial exposure). In FIG. 23, moving from left to right, (i) planarization layer 30 is exposed first through mask 72, (ii) mask 72 is moved to the left and exposed so that the central area is exposed twice and the left and right sides are each exposed only once, (iii) mask 72 is moved downward and exposed so that the central area is exposed three times, the right and top sides are exposed twice, and the bottom and the left sides are exposed once, (iv) mask 72 is moved right and exposed so that the central area is exposed four times, the adjacent top, left, and right sides are exposed three times, two upper corners are exposed twice, and the extreme right, left and bottom sides are exposed once, and (v) mask 72 is moved upward so that the central area is exposed five times, the adjacent sides are exposed four times, the corners are exposed three times, and the extreme sides are exposed once. FIG. 24 illustrates mask 72 exposing planarization layer 30 a variable number of times in one dimension. In FIG. 24, moving from left to right, (i) planarization layer 30 is exposed first through mask 72, (ii) mask 72 is moved to the left and exposed so that the central area is exposed twice and the left and right sides are each exposed only once, and (iii) mask 72 is moved left again (or to the right of the central area) and exposed so that the central area is exposed three times, the adjacent sides are exposed twice, and the extreme sides are exposed once.

Figure 28:
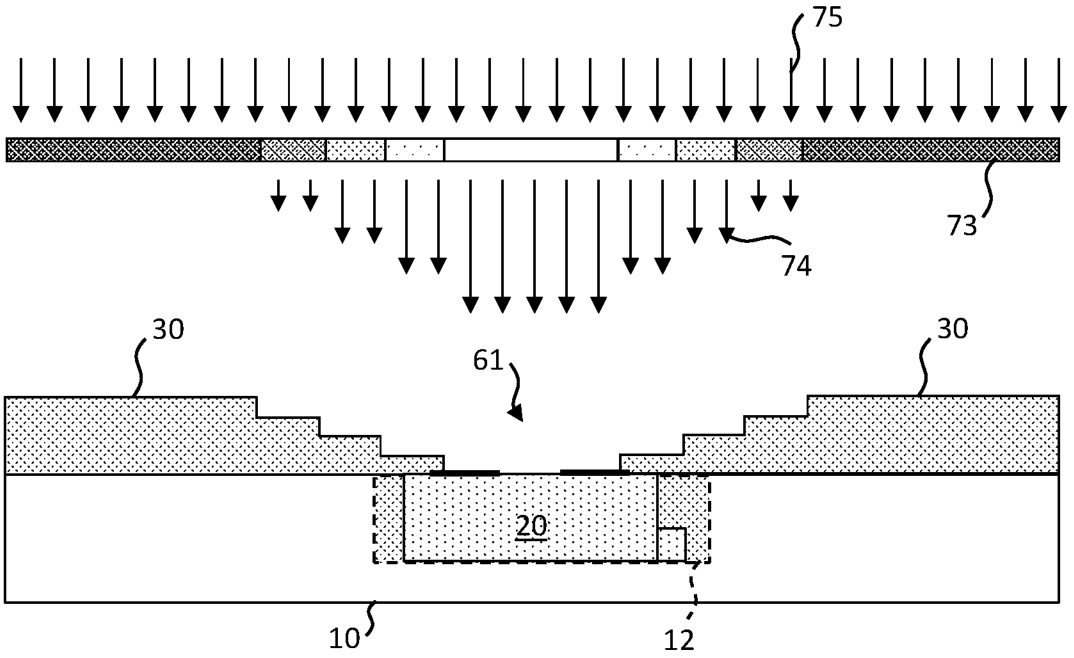
FIG. 28 is a cross section illustrating planarization layer exposure through a dithered mask according to illustrative embodiments of the present disclosure.
Figure 27A:
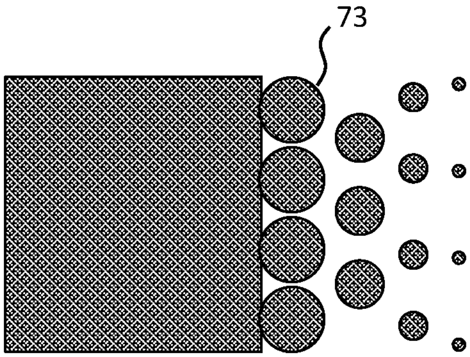
FIGS. 27A-27D illustrate half-tone patterns useful in dithered masks according to illustrative embodiments of the present disclosure.
Figure 27B:
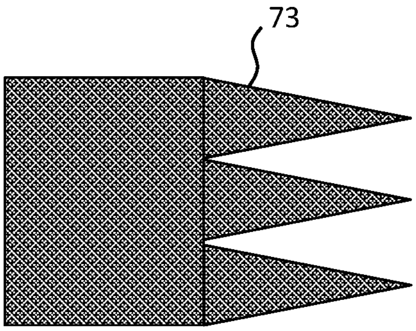
Figure 27C:
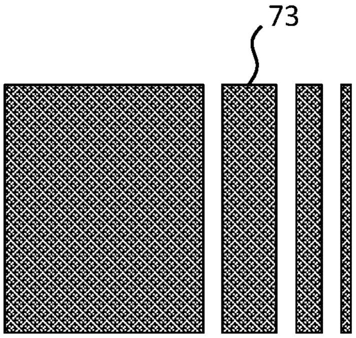
Figure 27D:
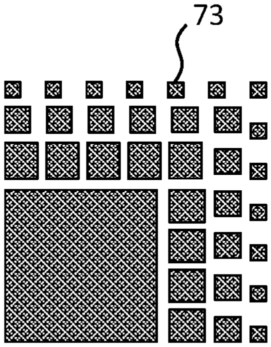

FIG. 28 illustrates the exposure of planarization layer 30 with transmitted electromagnetic radiation 75 in varying amounts and the consequent thickness of planarization layer 30 after developing planarization layer 30. As shown in FIG. 28, greater quantities of incident electromagnetic radiation 74 pass through more transparent portions of dithered mask 73 and expose planarization layer 30. After developing planarization layer 30, those portions of planarization layer 30 that received greater amounts of transmitted electromagnetic radiation 75 are thinner or entirely absent. Thus, planarization layer 30 has variable thickness and the edges of a low-resolution via 61 have a reduced slope compared to a high-resolution via 60 that is not dithered and receives a substantially binary amount of transmitted electromagnetic radiation 75 (e.g., a maximum amount or a minimum amount). The low-resolution via enables electrodes 50 with reduced slope and better coverage with greater conductivity on the more spatially extensive edges of low-resolution vias 61 made with dithered masks 73, for example as shown in FIG. 17.

Figure 29:
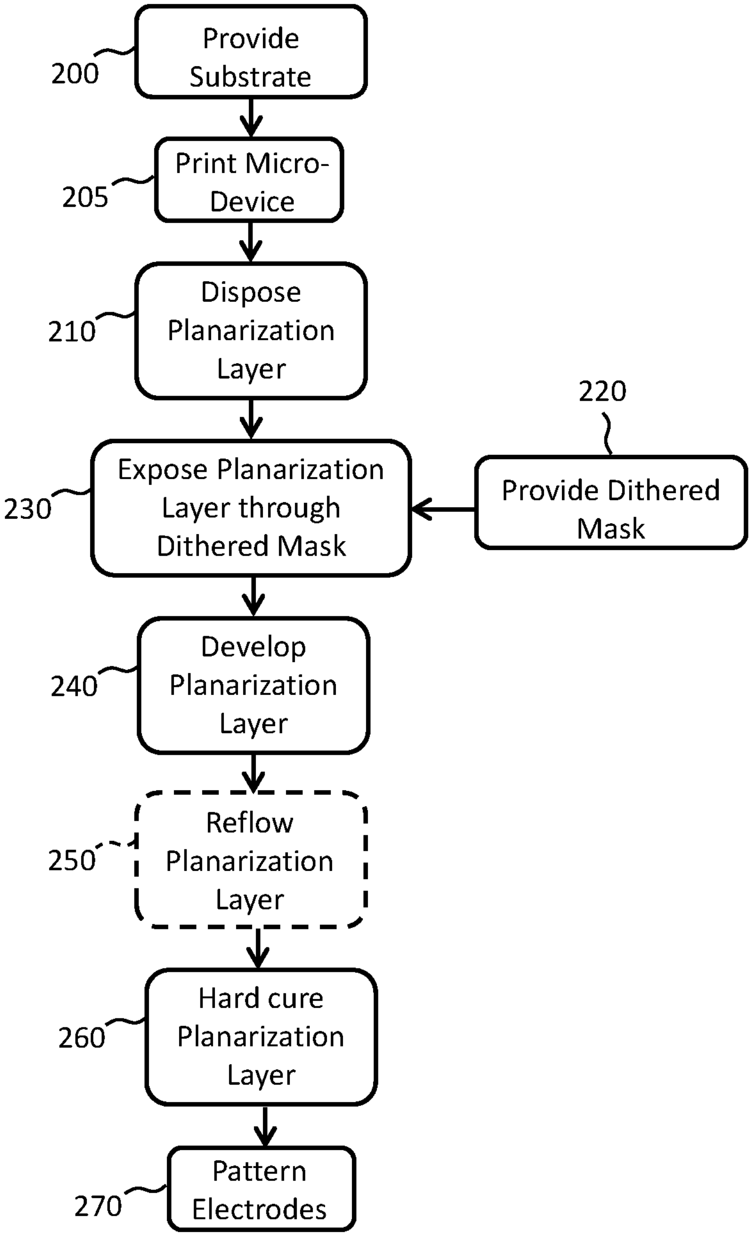
FIG. 29 is a flow diagram according to illustrative embodiments of the present disclosure.

As illustrated in FIG. 29, a method of making a substrate structure can comprise providing a substrate 10 having a substrate surface 11 in step 200. In some embodiments, a micro-device 20 is printed (e.g., micro-transfer printed with or without offset shear) onto substrate surface 11 or into a cavity 12 in substrate 10 in step 205. A curable layer (e.g., planarization layer 30) is disposed on substrate surface 11 (and micro-device 20 if present) in step 210, providing a dithered mask 73 over substrate surface 11 and over the curable layer, dithered mask 73 having light portions 79 that are substantially transparent, dark areas 78 that are substantially opaque, and dithered portions that are more transparent than dark areas 78 and less transparent than light areas 79 in step 220, exposing the curable layer to transmitted electromagnetic radiation 75 through dithered mask 73 to pattern and partially cure the curable layer forming completely cured portions of the curable layer, completely uncured portions of the curable layer, and portions of the curable layer that are partially cured in step 230, and developing the curable layer to cure the curable layer and form a patterned cured layer having a variable thickness in step 240. The patterned cured layer has a first via 60 (e.g., a high-resolution via 60) with a first via side width $W_V$ (e.g., substrate via side width $W_V$) and a second via 61 (e.g., a low-resolution via 61) having a second via side width $W_P$ (e.g., device via side width $W_P$) greater than the first via side width $W_V$. In some embodiments, optional step 250 comprises reflowing the patterned cured layer. This step 250 can be useful for dithered masks 30 that use structures such as those of FIGS. 27A-27D to smooth out locally exposed half-tone structures and provide a continuously variable thickness for planarization layer 30. The patterned cured layer can be hard cured in step 260 and, in some embodiments, electrodes 50 can be patterned over the patterned hard-cured layer and vias to electrically connect electrode contacts in step 270.

The variable thickness can have a slope with an angle no greater than 45 degrees, no greater than 30 degrees, no greater than 20 degrees, or no greater than 10 degrees.

Micro-device 20 can be or can include, for example, any one or more of an electronic component, a piezoelectric device, an integrated circuit, an electromechanical filter, an acoustic resonator, an antenna, a micro-heater, a micro-fluidic structure for containing and constraining fluids, a micro-mechanical device, and a power source, for example a piezo-electric power source. Micro-device(s) 20 can be electronic, optical, or optoelectronic devices that can be electrically, optically, or both electrically and optically interconnected to other micro-devices 20 or substrate circuit 40. Although many figures presented herein often illustrate a single micro-device 20, one of ordinary skill in the art will appreciate that there will generally be many such micro-devices 20 or cavities 12 (e.g., in a two-dimensional array). According to some embodiments, micro-device 20 has a thickness less than 1 mm (e.g., no greater than 500, 200, 100, 50, 20, 10, 5, 1, or 0.5 microns). According to some embodiments, micro-device 20 has a length or width less than 1 mm (e.g., no greater than 500, 200, 100, 50, 20, or 10 microns).

A micro-device 20 can be any device that has at least one dimension that is in the micron range, for example having a planar extent from 2 microns by 5 microns to 200 microns by 500 microns (e.g., an extent of 2 microns by 5 microns, 20 microns by 50 microns, or 200 microns by 500 microns) and, optionally, a thickness of from 200 nm to 200 microns (e.g., at least or no greater than 2 microns, 20 microns, or 200 microns). In some embodiments, micro-device 20 has a dimension as large as, or larger than 5 mm. Micro-device 20 can have any suitable aspect ratio or size in any dimension and any useful shape, for example a rectangular area or cross section. Micro-device 20 can be non-native to substrate 10. According to embodiments of the present disclosure, cavity 12 has a length and width over substrate 10 that is only slightly larger than a length and width of micro-device 20, for example 500 nm, one micron, two microns, three microns, five microns, ten microns, or twenty microns larger in length or width, or both length and width. Similarly, cavity 12 can have a thickness that is only slightly larger or smaller than a thickness of micro-device 20, for example no greater than twenty microns, no greater than ten microns, no greater than five microns, no greater than two microns, no greater than one micron, or no greater than 50 nm. Providing a cavity 12 with a depth approximately equal to a thickness of micro-device 20 reduces a step height S from micro-device top surface 21 and a substrate surface 11 of substrate 10. Providing a cavity 12 with an area over substrate surface 11 that is only slightly larger than an area of micro-device 20 likewise reduces the topology (changes in substrate surface 11 height with respect to a plane), improving the coating of an electrical conductor over substrate surface 11 and micro-device 20. According to embodiments of the present disclosure, micro-devices 20 can be micro-transfer printed into cavities 12 that have an area that is only a few, or less than one, microns larger in length and width than an area of the micro-devices 20. Other conventional methods such as pick-and-place used to dispose surface mount devices on a target substrate can be too inaccurate or too imprecise to effectively place micro-devices 20 into such cavities 12 and cannot readily dispose micro-devices with a length and width less than 200 microns.

According to some embodiments, micro-device 20 can be disposed over and native to a source wafer (e.g., a source substrate). A source wafer can comprise a sacrificial layer comprising anchor portions laterally separated by sacrificial portions in a direction parallel to a surface of the source wafer. Anchor portions can be a part of source wafer or a structure disposed on the source wafer. Micro-devices 20 can each be disposed over a sacrificial portion and physically connected by a tether 22 to an anchor portion. Sacrificial portions can be etched to form a gap between a micro-device 20 and the source wafer so that micro-devices 20 can be transfer printed from the source wafer to target substrate 10, thereby fracturing or separating tethers 22.

In some embodiments of the present disclosure, micro-devices 20 are small integrated circuits, which may be referred to as chiplets, having a thin micro-device substrate with at least one of (i) a thickness of only a few microns, for example less than or equal to 25 microns, less than or equal to 15 microns, or less than or equal to 10 microns, (ii) a width of 5-1000 microns (e.g., 5-10 microns, 10-50 microns, 50-100 microns, or 100-1000 microns), and (iii) a length of 5-1000 microns (e.g., 5-10 microns, 10-50 microns, 50-100 microns, or 100-1000 microns). Such chiplets can be made in a native source semiconductor wafer (e.g., a silicon wafer) having a process side and a back side used to handle and transport the source wafer using lithographic processes. Micro-devices 20 can be formed using lithographic processes in an active layer on or in the process side of a micro-device source wafer. Methods of forming such structures are described, for example, in U.S. Pat. No. 8,889,485. According to some embodiments of the present disclosure, source wafers can be provided with micro-devices 20, sacrificial layer (a release layer), sacrificial portions, and tethers 22 already formed, or they can be constructed as part of a process in accordance with certain embodiments of the present disclosure.

In certain embodiments, micro-devices 20 can be constructed using foundry fabrication processes used in the art. Layers of materials can be used, including materials such as metals, oxides, nitrides and other materials used in the integrated-circuit art. Micro-devices 20 can have different sizes, for example, less than 1000 square microns or less than 10,000 square microns, less than 100,000 square microns, or less than 1 square mm, or larger. Micro-devices 20 can have, for example, at least one of a length, a width, and a thickness of no greater than 500 microns (e.g., no greater than 250 microns, no greater than 100 microns, no greater than 50 microns, no greater than 25 microns, or no greater than 10 microns). Micro-devices 20 can have variable aspect ratios, for example at least 1:1, at least 2:1, at least 5:1, or at least 10:1. Micro-devices 20 can be rectangular or can have other shapes.

Tethers 22 can comprise any suitable tether material and can incorporate one or more layers, for example one or more layers similar to or the same as those layer(s) of micro-device 20, for example comprising electrode material, dielectric(s), or encapsulation layer(s), including resins, silicon oxides, silicon nitrides, or semiconductors. Tethers 22 can be constructed be depositing (e.g., by evaporation or sputtering) material such as oxide, nitride, metal, polymer, or semiconductor material, and patterning the material, for example using photolithographic methods and materials, such as pattern-wise exposed and etched photoresist.

Micro-device source wafers (e.g., source substrates) can be any useful substrate with a surface suitable for forming or having patterned sacrificial layers, sacrificial portions, anchor portions, and forming or disposing micro-devices 20. Source wafers can comprise glass, ceramic, polymer, metal, quartz, or semiconductors, for example as found in the integrated circuit or display industries. A sacrificial portion can be a designated portion of a sacrificial layer, for example an anisotropically etchable portion, for example designated by virtue of etchant applied to the source wafer is exposed to it relative to other portions of the source wafer, or a differentially etchable material from sacrificial layer, for example a buried oxide or nitride layer, such as silicon dioxide. A surface of the source wafer can be substantially planar and suitable for photolithographic processing, for example as found in the integrated circuit or MEMS art. Source wafers can be chosen, for example, based on desirable growth characteristics (e.g., lattice constant, crystal structure, or crystallographic orientation) for growing one or more materials thereon. In some embodiments of the present disclosure, the source wafer is anisotropically etchable. For example, a source wafer can be a monocrystalline silicon substrate with a {100} orientation. An anisotropically etchable material etches at different rates in different crystallographic directions, due to reactivities of different crystallographic planes to a given etchant. For example, potassium hydroxide (KOH) displays an etch rate selectivity 400 times higher in silicon [100] crystal directions than in silicon [111] directions. In particular, silicon {100} is a readily available, relatively lower cost monocrystalline silicon material. Moreover, in some embodiments, micro-devices 20 made on or in a silicon {100} crystal structure can have less stress and therefore less device bowing after release.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section
D distance

S step height
$W_P$ device via side width
$W_V$ via side width
10 substrate/target substrate
11 substrate surface
12 cavity
12A first cavity
12B second cavity
13 cavity side
14 adhesive layer
20 micro-device
20A first micro-device
20B second micro-device
21 micro-device top surface
22 tether
23 micro-device side
24 micro-device contact
24A micro-device contact
24B micro-device contact
26 dielectric structure
30 planarization layer
31 planarization layer surface
40 substrate circuit
44 substrate contact
50 electrode
60 via
61 low-resolution via
62 pit/trench
64 protrusion/bump
70 poor electrode coverage
72 mask
73 dithered mask
74 incident electromagnetic radiation
75 transmitted electromagnetic radiation
76 mask substrate
77 dithered film
78 dark areas
79 light areas
80 stamp
82 stamp post
90 micro-device structure
100 provide target substrate step
110 provide micro-device source wafer step
120 etch cavity in target substrate step
130 print micro-device into cavity step
140 planarize structure step
150 pattern vias step
160 form electrodes step
200 provide substrate step
205 print micro-device step
210 dispose planarization layer step
220 provide dithered mask step
230 expose planarization layer through dithered mask step
240 develop planarization layer step
250 optional reflow planarization layer step
260 hard cure planarization layer step
270 pattern electrodes step

The invention claimed is:

1. A micro-device structure, comprising:
a substrate having a substrate surface;
a cavity extending into the substrate from the substrate surface, wherein the cavity has a sidewall extending into the substrate from the substrate surface;
a micro-device disposed in the cavity away from the sidewall; and
a planarization layer disposed over at least a portion of the substrate, in at least a portion of the cavity, and in contact with the micro-device and the sidewall,
wherein the planarization layer has a pit disposed between the micro-device and the sidewall in a direction parallel to the substrate surface,
wherein a surface of the planarization layer opposite the substrate extends into the cavity below a top surface of the micro-device opposite the substrate, and
wherein the planarization layer extends over only a portion of the micro-device so that at least a portion of the micro-device is exposed.

2. The micro-device structure of claim 1, comprising:
a via formed through the planarization layer that exposes a portion of the substrate surface or exposes a layer or structure disposed on the substrate surface,
wherein the substrate comprises a substrate contact disposed on the substrate in the via, the micro-device comprises a micro-device contact disposed on a surface of the micro-device opposite the substrate, and the micro-device structure comprises an electrode disposed on a portion of the planarization layer opposite the substrate that electrically connects the substrate contact to the micro-device contact, and
the micro-device contact is a first micro-device contact and the micro-device comprises a second micro-device contact disposed on the surface of the micro-device opposite the substrate and wherein a first portion having a first area of the first micro-device contact is exposed through the planarization layer, a second portion having a second area of the second micro-device contact is exposed through the planarization layer, and the first area of the first portion is larger than the second area of the second portion.

3. The micro-device structure of claim 1, wherein the pit is at least partly in the cavity.

4. The micro-device structure of claim 1, wherein the pit is directly over the cavity.

5. The micro-device structure of claim 1, wherein a cavity depth of the cavity is different from a micro-device height of the micro-device.

6. The micro-device structure of claim 1, comprising a via formed through the planarization layer that exposes a portion of the substrate surface or exposes a layer or structure disposed on the substrate surface.

7. The micro-device structure of claim 6, wherein (i) the planarization layer has a planarization layer surface on a side of the planarization layer opposite the substrate and the micro-device has a micro-device surface on a side of the micro-device opposite the substrate, (ii) the via has a via side width that extends from the planarization layer surface to the substrate surface or to the layer or structure formed on the substrate surface, (iii) the planarization layer has a device via side width that extends from the planarization layer surface to the micro-device surface, and (iv) the device via side width is greater than the via side width.

8. The micro-device structure of claim 6, wherein (i) the planarization layer has a planarization layer surface on a side of the planarization layer opposite the substrate and the micro-device has a micro-device surface on a side of the micro-device opposite the substrate, (ii) the via has a via edge that extends from the planarization layer surface to the substrate surface or to the layer or structure formed on the substrate surface, wherein the via edge has an average via slope with respect to the substrate surface, (iii) the planarization layer has a planarization edge that extends from the planarization layer surface to the micro-device surface, wherein the planarization edge has an average micro-device planarization slope with respect to the substrate surface, and (iv) the via slope is greater than the micro-device planarization slope.

9. The micro-device structure of claim 6, wherein the substrate comprises a substrate contact disposed on the substrate in the via, the micro-device comprises a micro-device contact disposed on a surface of the micro-device opposite the substrate, and the micro-device structure comprises an electrode disposed on a portion of the planarization layer opposite the substrate that electrically connects the substrate contact to the micro-device contact.

10. The micro-device structure of claim 1, wherein a side of the micro-device non-parallel to the substrate surface is closer to a side of the cavity non-parallel to the substrate surface than any other side of the micro-device non-parallel to the substrate surface is to any side of the cavity.

11. The micro-device structure of claim 10, wherein the side of the micro-device is in contact with the side of the cavity or is within one micron of the side of the cavity.

12. The micro-device structure of claim 10, wherein two sides of the micro-device non-parallel to the substrate surface are each closer to a respective one of two sides of the cavity non-parallel to the substrate surface than any other sides of the micro-device non-parallel to the substrate surface are to any side of the cavity.

13. The micro-device structure of claim 1, wherein a center of the micro-device is not coincident with a center of the cavity.

14. The micro-device structure of claim 1, wherein a surface of the micro-device opposite the substrate extends farther from the substrate surface than a surface of the planarization layer opposite the substrate.

15. The micro-device structure of claim 1, wherein a surface of the planarization layer opposite the substrate extends farther from the substrate surface than a surface of the micro-device opposite the substrate.

16. The micro-device structure of claim 1, wherein a surface of the micro-device opposite the substrate is below a surface of the planarization layer with respect to the substrate.

17. The micro-device structure of claim 1, wherein the micro-device is entirely within the cavity.

18. The micro-device structure of claim 1, wherein the micro-device is only partly within the cavity and extends above the cavity with respect to the substrate.

19. The micro-device structure of claim 1, wherein the planarization layer extends over only a portion of a surface of the micro-device opposite the substrate.

20. The micro-device structure of claim 1, wherein the micro-device comprises a broken or separated micro-device tether, is a bare, unpackaged die, or both.

21. The micro-device structure of claim 1, wherein the planarization layer is a cured organic planarization layer.

* * * * *